United States Patent
Saber et al.

(10) Patent No.: US 10,812,107 B2
(45) Date of Patent: Oct. 20, 2020

(54) APPARATUS AND METHODS FOR POLAR CODE CONSTRUCTION AND BIT POSITION ALLOCATION

(71) Applicant: HUAWEI TECHNOLOGIES CO., LTD., Shenzhen, Guangdong (CN)

(72) Inventors: Hamid Saber, Ottawa (CA); Yiqun Ge, Kanata (CA)

(73) Assignee: Huawei Technologies Co., Ltd., Shenzhen (CN)

(*) Notice: Subject to any disclaimer, the term of this patent is extended or adjusted under 35 U.S.C. 154(b) by 192 days.

(21) Appl. No.: 15/875,403

(22) Filed: Jan. 19, 2018

(65) Prior Publication Data
US 2019/0229752 A1    Jul. 25, 2019

(51) Int. Cl.
*H03M 13/00* (2006.01)
*H03M 13/13* (2006.01)
(Continued)

(52) U.S. Cl.
CPC ....... *H03M 13/13* (2013.01); *H03M 13/2906* (2013.01); *H04L 1/0041* (2013.01);
(Continued)

(58) Field of Classification Search
CPC .... H03M 13/13; H04L 1/0057; H04L 1/0058; H04L 1/0061; H04L 1/0072;
(Continued)

(56) References Cited

U.S. PATENT DOCUMENTS

| | | | | |
|---|---|---|---|---|
| 2009/0067355 A1* | 3/2009 | Haartsen | ............... | H04W 72/08 370/311 |
| 2013/0117344 A1* | 5/2013 | Gross | ...................... | G06F 17/10 708/490 |

(Continued)

FOREIGN PATENT DOCUMENTS

| | | |
|---|---|---|
| CN | 107332571 A | 11/2017 |
| CN | 107425857 A | 12/2017 |

OTHER PUBLICATIONS

E. Arikan, "Channel polarization: A method for constructing capacity-achieving codes for symmetric binary-input memoryless channels," IEEE Transactions on Information Theory, vol. 55, No. 7, 2009, pp. 3051-3073.

(Continued)

*Primary Examiner* — Albert Decady
*Assistant Examiner* — Osman M Alshack

(57) ABSTRACT

A sub-channel to carry an information bit, in input bits that are to be encoded, is selected from each of multiple subsets of sub-channels that are provided by a length N polar code. The subsets include sub-channels that are associated with respective overlapping constituent polar codes of the length N polar code. The constituent polar codes are of length $N_{ref} < N$. An ordered sequence of length $N_{ref}$, instead of a longer ordered sequence of length N, may be used in selecting the sub-channels. The input bits are encoded to generate a codeword, and the codeword is transmitted.

15 Claims, 18 Drawing Sheets

(51) Int. Cl.
  *H03M 13/29* (2006.01)
  *H04L 1/00* (2006.01)
(52) U.S. Cl.
  CPC .......... *H04L 1/0058* (2013.01); *H04L 1/0042* (2013.01); *H04L 1/0045* (2013.01); *H04L 1/0057* (2013.01); *H04L 1/0061* (2013.01); *H04L 1/0072* (2013.01); *H04L 1/0083* (2013.01)
(58) Field of Classification Search
  CPC ... H04L 1/0041; H04L 1/0042; H04L 1/0045; H04L 1/0083
  USPC .................................................. 714/752, 776
  See application file for complete search history.

(56) References Cited

U.S. PATENT DOCUMENTS

| | | | | |
|---|---|---|---|---|
| 2015/0295593 | A1* | 10/2015 | Trifonov | H03M 13/3746 714/776 |
| 2016/0013810 | A1* | 1/2016 | Gross | H03M 13/09 714/776 |
| 2016/0285479 | A1* | 9/2016 | El-Khamy | H03M 13/6368 |
| 2017/0230059 | A1* | 8/2017 | Giard | H03M 13/134 |
| 2017/0353271 | A1* | 12/2017 | Kudekar | H03M 13/612 |
| 2018/0375612 | A1* | 12/2018 | Sarkis | H04L 1/0058 |
| 2018/0375615 | A1* | 12/2018 | Xu | H04L 1/0054 |
| 2019/0036550 | A1* | 1/2019 | Koike-Akino | H03M 13/1555 |
| 2019/0052418 | A1* | 2/2019 | Li | H03M 13/13 |
| 2019/0245650 | A1* | 8/2019 | Hui | H03M 13/13 |

OTHER PUBLICATIONS

Tal and Vardy, "List Decoding of Polar Codes", Proceedings of the 2011 IEEE International Symposium on Information Theory, Jul. 2011, 11 pages.

Mori R, Tanaka T., "Performance and construction of polar codes on symmetric binary-input memoryless channels", IEEE International Symposium on Information Theory, 2009, pp. 1496-1500.

J.Dai, K.Niu, Z.Si, J.Lin, "Evaluation and Optimization of Gaussian Approximation for Polar Codes", May 2016, 4 pages.

P. Trifonov, "Efficient design and decoding of polar codes." IEEE Transactions on Communications 60.11 (2012): pp. 3221-3227.

R1-1611254, "Details of the Polar Code Design", Huawei & HiSilicon, 3GPP TSG RAN WG1 Meeting #87, 33 pages.

A. J. Ferrus, C. Hirche and D. Poulin, "Convolutional Polar Codes", arXiv:1704.00715, Apr. 3, 2017, 25 pages.

R1-1700089, "Performance of polar codes for control channel", Huawei & HiSilicon, 3GPP TSG RAN WG1 Ad-Hoc Meeting, Jan. 16-20, 2017.

* cited by examiner $$G_2 = \begin{bmatrix} 1 & 0 \\ 1 & 1 \end{bmatrix} \quad G_2^{\otimes 2} = \begin{bmatrix} G_2 & 0 \\ G_2 & G_2 \end{bmatrix} \quad G_2^{\otimes 3} = \begin{bmatrix} G_2 & 0 & 0 & 0 \\ G_2 & G_2 & 0 & 0 \\ G_2 & 0 & G_2 & 0 \\ G_2 & G_2 & G_2 & G_2 \end{bmatrix}$$

$$G_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix}$$

$$G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

FIG. 1

APPARATUS AND METHODS FOR POLAR CODE CONSTRUCTION AND BIT POSITION ALLOCATION

FIELD

The present disclosure relates to generally to communications and, in particular, to construction of polar codes and allocating bit positions.

BACKGROUND

Polar codes are proposed as channel codes for use in future wireless communications, and have been selected for uplink and downlink enhanced Mobile Broadband (eMBB) control channel coding for the new $5^{th}$ Generation (5G) air interface, also known as the 5G New Radio (NR). These codes are competitive with state-of-the-art error correction codes and have low encoding complexity. See E. Arikan, "Channel polarization: A method for constructing capacity-achieving codes for symmetric binary-input memoryless channels," IEEE Trans. Inf. Theory, vol. 55, no. 7, pp. 3051-3073, 2009. Successive Cancellation List (SCL) decoding and its extensions (e.g., SC List decoding) are effective and efficient options for decoding polar coded information.

Based on channel polarization, Arikan designed a channel code that is proven to reach channel capacity. Polarization refers to a coding property that, as code length increases to infinity, bit-channels also referred to as sub-channels polarize and their capacities approach either zero (completely noisy channel) or one (completely perfect channel). In other words, bits encoded in high capacity sub-channels will experience a channel with high Signal-to-Noise Ratio (SNR), and will have a relatively high reliability or a high likelihood of being correctly decoded, and bits encoded in low capacity sub-channels will experience a channel with low SNR, and will have low reliability or a low possibility to be correctly decoded. The fraction of perfect bit-channels is equal to the capacity of this channel.

SUMMARY

Illustrative embodiments are disclosed herein by way of example.

According to one aspect of the present disclosure, A method for encoding and transmitting input bits involves selecting, from each of multiple subsets of sub-channels that are provided by a length N polar code, a sub-channel to carry an information bit in the input bits that are to be encoded. The subsets include sub-channels that are associated with respective overlapping constituent polar codes of the length N polar code, and the constituent polar codes are of length $N_{ref}<N$. The input bits are encoded to generate a codeword, and the codeword is transmitted.

A non-transitory processor-readable medium stores instructions which, when executed by one or more processors, cause the one or more processors to perform a method for encoding and transmitting input bits. In an embodiment, the method involves selecting sub-channel to carry information bits in the input bits that are to be encoded, encoding the input bits to generate a codeword, and transmitting the codeword. The selecting involves selecting, from each of multiple subsets of sub-channels that are provided by a length N polar code, a sub-channel to carry an information bit. The subsets include sub-channels that are associated with respective overlapping constituent polar codes of the length N polar code, and the constituent polar codes are of length $N_{ref}<N$.

An apparatus for encoding and transmitting input bits is also disclosed. According to one embodiment, the apparatus includes an encoder to select, from each of a multiple subsets of sub-channels that are provided by a length N polar code, a sub-channel to carry an information bit in the input bits that are to be encoded, and to encode the input bits to generate a codeword. The subsets include sub-channels that are associated with respective overlapping constituent polar codes of the length N polar code, and the constituent polar codes are of length $N_{ref}<N$. A transmitter is coupled to the encoder to transmit the codeword.

Other aspects and features of embodiments of the present disclosure will become apparent to those ordinarily skilled in the art upon review of the following description.

BRIEF DESCRIPTION OF THE DRAWINGS

Examples of embodiments will now be described in greater detail with reference to the accompanying drawings.

FIG. 1 is a diagram showing one example of how a polar coding generator matrix can be produced from a kernel.

DETAILED DESCRIPTION

FIG. 1 is a diagram showing, by way of an illustrative example, how a polar coding generator matrix can be produced from a kernel $G_2$ 100. Note that FIG. 1 is an example. Other forms of kernel are also possible.

A polar code can be formed from a Kronecker product matrix based on a seed matrix $F=G_2$ 100. For a polar code having codewords of length $N=2^m$, the generator matrix is $G_2^{\otimes m}$. The 2-fold Kronecker product matrix $G_2^{\otimes 2}$ 102 and the 3-fold Kronecker product matrix $G_2^{\otimes 3}$ 104 in FIG. 1 are examples of polar coding generator matrices. The generator matrix approach illustrated in FIG. 1 can be expanded to produce an m-fold Kronecker product matrix $G_2^{\otimes m}$.

Figures 2, 3:
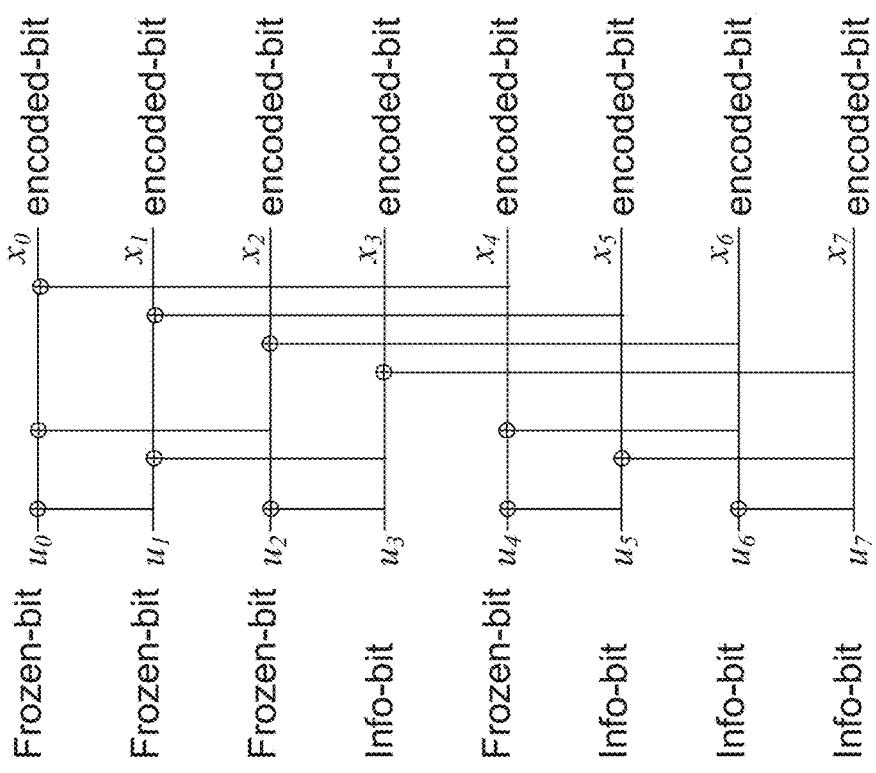
FIGS. 2 and 3 show an example use of a polar coding generator matrix for producing codewords and a schematic illustration of an example polar encoder.

FIGS. 2 and 3 show an example use of a polar coding generator matrix for producing codewords and a schematic illustration of an example polar encoder. In FIG. 2, the generator matrix $G_2^{\otimes 3}$ 104 is used to produce codewords of length $2^3=8$. A codeword x is formed by the product of an input vector $u=[0\ 0\ 0\ u_3\ 0\ us\ u_6\ u_7]$ and the generator matrix $G_2^{\otimes 3}$ 104 as indicated at 200. The input vector u is composed of information bits and fixed or frozen bits. In the specific example shown in FIGS. 2 and 3, N=8, so the input vector u is an 8-bit vector, and the codeword x is an 8-bit vector. The input vector has frozen bits in positions 0, 1, 2 and 4, and has information bits at positions 3, 5, 6, and 7. An example implementation of an encoder that generates codewords is indicated in FIG. 3 at 212, where the frozen bits are all set to 0, and the circled "+" symbols represent modulo 2 addition. For the example of FIGS. 2 and 3, an N=8-bit input vector is formed from K=4 information bits and N−K=4 frozen bits. Codes of this form are referred to as polar codes and the encoder is referred to as a polar encoder. Decoders for decoding polar codes are referred to as polar decoders. Frozen bits are set to zero in the example shown in FIGS. 2 and 3. However, frozen bits could be set to other bit values that are known to both an encoder and a decoder. For ease of description, all-zero frozen bits are considered herein, and may be generally preferred.

As is known, polar coding may be performed with or without bit reversal. The example polar encoder in FIG. 3 is without bit reversal.

Generally, the output of a polar encoder can be expressed as $x_0^{N-1}=u_0^{N-1}G_N$, where, without bit reversal, $G_N=F^{\otimes n}$ is an N-by-N generator matrix, $N=2^n$, $n\geq 1$ (e.g. for n=1, $G_2=F$ (indicated as 100 in FIG. 1)). For bit reversal, $G_N=B_N F^{\otimes n}$, where $B_N$ is an N-by-N bit-reversal permutation matrix.

Embodiments disclosed herein could be implemented without or with bit reversal.

In polar code construction, ideally the more "reliable" positions of an input vector are used to carry the information bits, and the more "unreliable" positions of an input vector are used to carry the frozen bits (i.e., bits already known to both encoder and decoder). However, when information is transmitted over a physical channel, the reliability of a given bit position is also a function of the characteristics of the physical channel, such as the erasure rate or the Signal-to-Noise Ratio (SNR) of the physical channel. A reliability sequence (reliable and unreliable positions) could be calculated based on assumed or measured characteristics of the physical channel before the information is transmitted over the channel, for example. In theory, the frozen bits can be set to any value as long as the location of each frozen bit is known to both the encoder and the decoder. In conventional applications, the frozen bits are all set to zero.

With a sufficiently long code length, a code designed according to polarization theory can reach the channel capacity in a binary symmetric memoryless channel if a Successive Cancellation (SC) decoding algorithm is used. A very simple SC decoding algorithm was analyzed and simulated by Arikan.

In practice, a code length cannot be infinite and a channel cannot be a binary memoryless channel, and therefore channel capacity cannot be reached by such a simple SC decoder. According to Arikan, the channel capacity can be approached when using SC decoding if a code length is over $2^{20}$ bits in an AWGN channel. Such a long code length is impractical in wireless communications, for example.

Assistant or error-detecting code (EDC) bits can be included in the input vector to assist in decoding. A cyclic redundancy check (CRC) code could be used as an EDC. More than one EDC could be used within one codeword. However, it should be understood that other EDCs, such as a checksum code or a Fletcher Code, may be used. Some EDCs are also error-correcting codes (ECCs).

CRC bits, for example, are generated based on the information bits being transmitted. CRC bits are generally placed in more reliable positions in the input vector, although CRC bits may also or instead be placed in other positions in the input vector. CRC bits may be used in path selection for List decoding, for example, to improve polar code performance. During encoding, an N-bit input vector could be formed from K information bits, including one or more CRC bits, and (N−K) frozen bits. In this example, starting with a number of input bits, a CRC is calculated and appended to the input bits to produce a set of information K bits including the input bits and the CRC bits. The remaining (N−K) frozen bits are inserted to produce an N-bit input vector, where N is a power of 2 in an Arikan polar code. The input vector is then multiplied by a generator matrix for a polar code to produce an N-bit codeword.

The codeword is transmitted over a channel, and a receiver, in turn, receives a word. Due to channel effects such as noise, the received word might not be identical to the transmitted codeword. A decoder attempts to decode the received word to determine information bits in the original input vector.

During decoding of a codeword encoded from an input vector, the locations and values of frozen bits in the input vector are treated as known. For descriptive simplicity, bits of the input vector that are not known to the decoder in advance will be referred to as "unknown" bits. For example, the information bits including any the CRC bits are unknown bits. Some polar decoders use SC decoding as noted above, in which the unknown bits are decoded sequentially and successive cancellation is applied. Once a particular decision has been made regarding how an unknown bit is to be decoded, SC polar decoders do not allow that bit to be changed or corrected, and the decoder moves on to decoding the next unknown bit.

An extension of SC polar decoding algorithm with better error correction performance, referred to as List or SCL decoding, is described in "List Decoding of Polar Codes" by Tal and Vardy, *Proceedings of the* 2011 *IEEE International Symposium on Information Theory*, pp. 1-5 (July 2011). In a List decoder, successive levels of a binary decision tree are generated, each level corresponding to a decision on a respective unknown bit. Each (decoding) path in the decision tree from the root node to leaf nodes represents a possible partial decoded sequence of unknown bits and has a corresponding likelihood. Typically, during generation of the decision tree, at each level of the decision tree where the number of paths grows beyond a set threshold L, the L paths having the highest likelihoods are identified, and the remaining paths are discarded. Some List decoders may also make use of CRC bits included in the codeword to assist in decoding. For example, if the codeword includes encoded CRC bits for the previous information bits, then once the decision tree is generated, each of the surviving paths that corresponds to decoded information bits is checked against the CRC bits represented in each of those surviving paths. The decoder then outputs as a decoded vector the information bits in the surviving path that passes the CRC check. If more than one path passes the CRC check, then the decoder selects for output the path that passes the CRC check and has the highest likelihood, which may be determined according to a metric. If no path passes the CRC check, or if the codeword does not include encoded CRC bits, then the decoder selects for output the path that has the highest likelihood, which as noted above may be determined according to a metric.

Thus, there are two types of the decoding based on successive cancellation, including SC decoding and List decoding, which is also referred to as SCL decoding. For every decoded bit, a decoding path generates 2 leaf branches (bit=0|1) for the next decoding bit. An SC decoder tracks only one decoding path. After the value of a decoded bit is estimated, the other possible value is ignored. Decoding continues with the next bit, assuming that each previous bit has been correctly estimated when updating partial sum results.

Figure 4:
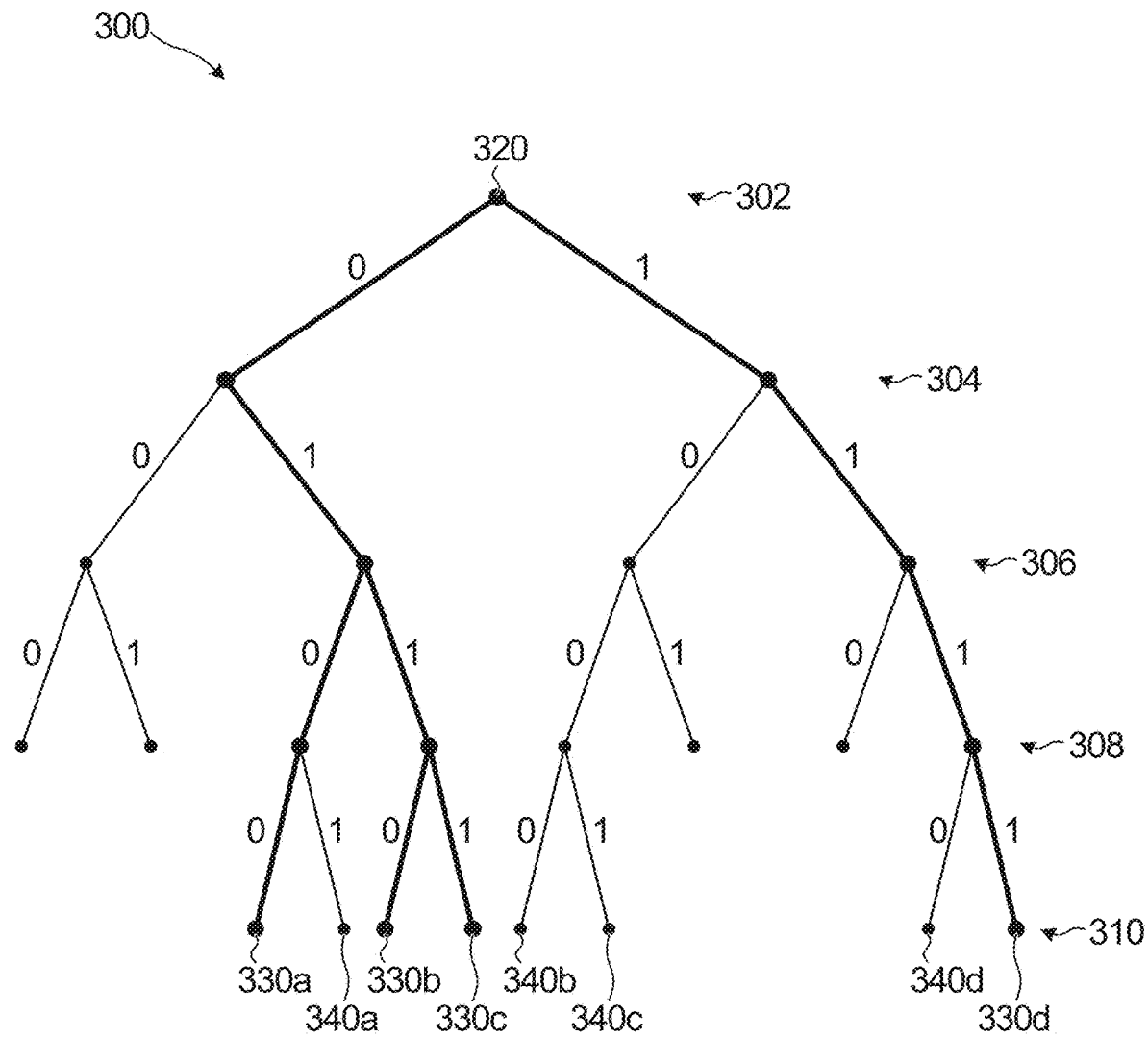
FIG. 4 is a diagram showing a portion of an example decision list tree whose width is limited by a maximum given list size and used in an SCL (Successive Cancellation List) polar decoder.

FIG. 4 is a diagram showing a portion of an example decision list tree 300 used in an SCL polar decoder, whose width is limited by a maximum given list size L. In FIG. 4 the list size L is 4. Five levels 302, 304, 306, 308, 310 of the decision tree are illustrated. Although five levels are illustrated, it should be understood that a decision tree to decode K information bits (including CRC bits) would have K+1 levels. At each level after the root level 302, each one of up to 4 surviving decoding paths is extended by one bit. The leaf or child nodes of root node 320 represent possible choices for a first bit, and subsequent leaf nodes represent possible choices for subsequent bits. The decoding path from the root node 320 to leaf node 330a, for example, represents an estimated codeword bit sequence: 0, 1, 0, 0. At level 308, the number of possible paths is greater than L, so L paths having the highest likelihood (e.g. best Path Metrics) are identified, and the remaining paths are discarded. The decoding paths that survive after the path sort at level 306 are shown in bold in FIG. 4. Similarly, at level 310, the number of possible paths is again greater than L, so the L paths having the highest likelihood (best PMs) are identified, and the remaining paths are again discarded. In the example shown, the paths terminating in leaf nodes 330a, 330b, 330c, and 330d represent the highest likelihood paths. The paths terminating in leaf nodes 340a, 340b, 340c, 340d are the lower likelihood paths which are discarded.

SCL decoding can be further divided into pure list decoding in which survivor paths with the highest likelihood are selected and CRC-Aided SCL (CA-SCL) decoding where CRC bits are used for path selection. SC decoding is a special case of pure list decoding, with list size L=1. A CRC may provide better error correction performance in the final path selection, but is optional in SCL decoding. Other decoding-assistant operations, such as a Parity Check (PC) based on parity or "PC" bits that are included in an input vector, could be used instead of or jointly with CRC bits in path selection during decoding or in the final path selection.

In an Additive White Gaussian Noise (AWGN) channel, a polar code in effect divides a channel into N sub-channels, where N is referred to as mother code length and is always is power of 2 in an Arikan polar code, which is based on a polar kernel that is a 2×2 matrix. A key to code construction for a polar code is to determine which bit-channels, also referred to herein as sub-channels, are selected or allocated for information bits and which sub-channels are allocated for frozen bits. In some embodiments, one or more sub-channels are also allocated to parity/PC, CRC, and/or other types of bits that are used to assist in decoding. In terms of polarization theory, the sub-channels that are allocated for frozen bits are called frozen sub-channels, the sub-channels that are allocated for information bits are called information sub-channels, and additional assistant sub-channels may be allocated to assistant bits that are used to assist in decoding. In some embodiments, assistant bits are considered to be a form of information bits, for which more reliable sub-channels are selected or allocated.

Figure 5:
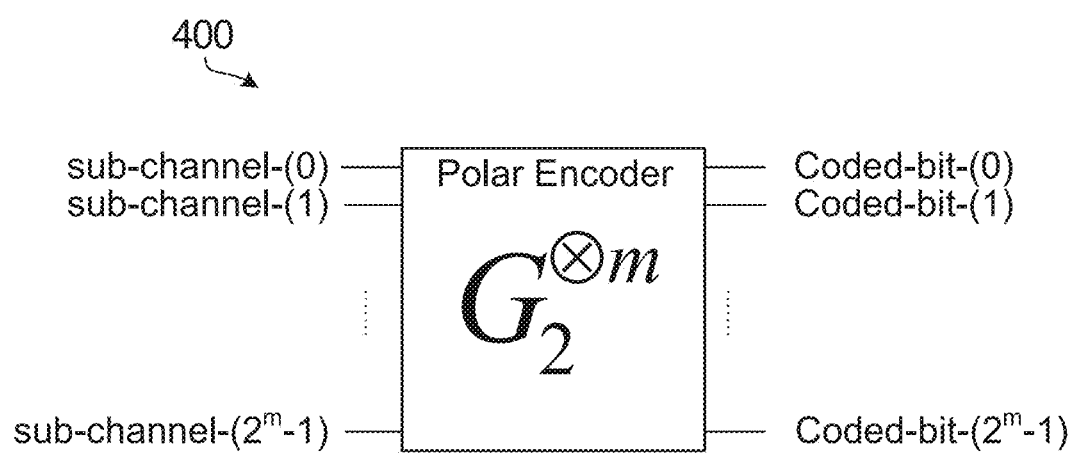
FIG. 5 is a block diagram illustrating an example of a polar encoder based on a 2-by-2 kernel.

Polar encoders based on Kronecker products of a 2-by-2 Arikan kernel $G_2$ are described above. FIG. 5 is a block diagram illustrating an example of a polar encoder 400 based on a 2-by-2 kernel. Sub-channels and coded bits are labeled in FIG. 5. A channel is divided into N sub-channels by a polar code as noted above. An information block and frozen bits are allocated onto the N sub-channels, and the resultant N-sized vector is multiplied with an N-by-N Kronecker matrix by the polar encoder 400 to generate a codeword that includes N coded bits. An information block includes at least information bits and could also include assistant bits such as CRC bits or PC bits. A sub-channel selector (not shown) could be coupled to the polar encoder 400 to select sub-channels for information bits and any assistant bits, with any remaining sub-channels being frozen sub-channels.

For polar codes that are based on a 2-by-2 kernel and an N-by-N Kronecker matrix, N is a power of 2. This type of kernel and polar codes based on such a kernel are discussed herein as illustrative examples. Other forms of polarization kernels with a different size (or number of inputs) could be generally characterized by code length $N=L^n$, where L is the dimension (i.e., size or number of inputs) of the applied kernel. In addition, polarization kernels such as other prime-number kernels (e.g. 3-by-3 or 5-by-5) or combinations of (prime or non-prime number) kernels to produce higher-order kernels could yield polarization among code sub-channels. It should also be noted that coded bit processing such as puncturing, shortening, zero padding, and/or repetition could be used in conjunction with polar codes that are based on 2-by-2 kernels or other types of kernels, for rate matching and/or other purposes for example.

As a result of SC, SCL, or CA-SCL decoding, the polarization phenomenon appears over these synthesized sub-channels. Some synthesized channels have high capacity, and some have low capacity. Put another way, some synthesized sub-channels have equivalently high Signal-to-Noise Ratio (SNR) and others have equivalently low SNR. These metrics are examples of characteristics that could be used to quantify or classify sub-channel "reliability". Other metrics indicative of sub-channel reliability could also or instead be used.

Code construction involves determining a code rate (the number of information bits K, or how many sub-channels are to carry information bits) and selecting the particular K sub-channels among the N available sub-channels that are to carry information bits. For ease of reference herein, information bits could include input bits that are to be encoded, and possibly CRC bits, PC bits, and/or other assistant bits that are used to assist in decoding. Sub-channel selection is based on reliabilities of the sub-channels, and typically the highest reliability sub-channels are selected as information sub-channels for carrying information bits.

Sub-channel reliabilities could be specified, for example, in one or more ordered sequences. A single, nested, SNR-independent ordered sequence of sub-channels could be computed for a code length $N_{max}$, with ordered sequences for shorter code lengths N being selected from the longer $N_{max}$ sequence. Multiple ordered sequences in terms of different mother code lengths $N_i$ could instead be computed, and one of the mother code length sequences could be selected for a particular code based on preferred code length. Another possible option involves computing multiple ordered sequences in terms of SNR values, for example, and selecting an ordered sequence based on measured SNR.

There are also several methods to compute sub-channel reliabilities. For example, Mori R, Tanaka T., "Performance and construction of polar codes on symmetric binary-input memoryless channels", IEEE International Symposium on Information Theory, 2009, 1496-1500, proposes a density evolution (DE) method in which the reliability of a sub-channel is measured using the decoding error probabilities of Belief Propagation decoding, which can be calculated via density evolution. The proposed method is proven to be capacity-achieving for arbitrary symmetric binary erasure channels when used for polar construction. However, because the method relies on iterative calculations of Log Likelihood Ratio (LLR) values for each sub-channel, it is computationally complex.

A Gaussian-approximation (GA) method proposed in P. Trifonov, "Efficient design and decoding of polar codes." IEEE Trans. on Communications 60.11 (2012): 3221-3227, assumes that every coded bit is subjected to an equal error probability. From the error probability, the reliabilities over the sub-channels are obtained with a density evolution (DE) algorithm. Because this error probability on the coded bits is related to the receiving SNR, this method is SNR-related and is computationally complex.

According to a genie-aided method proposed in E. Arikan, "Channel polarization: A method for constructing capacity-achieving codes for symmetric binary-input memoryless channels", IEEE Transactions on Information Theory, 2009, 55(7): 3051-3073, an encoder encodes on different sub-channels a training sequence that is known to the decoder. The decoder feeds back decoding results to the encoder so that the encoder can compute reliability statistics for every sub-channel, and a well-adapted reliability-vector over the sub-channels is obtained. The relative reliabilities for the sub-channels are dependent on the receiving SNR, making this method an SNR-dependent method.

Gaussian-approximation methods as proposed in J. Dai, K. Niu, Z. Si, J. Lin, "Evaluation and Optimization of Gaussian Approximation for Polar Codes", May 2016, and in P. Trifonov, "Efficient design and decoding of polar codes." IEEE Trans. on Communications 60.11 (2012): 3221-3227, assume that every coded bit is subjected to an equal error probability. From the error probability, the reliabilities over the sub-channels are obtained with a density evolution algorithm. Because this error probability on the coded bits is related to the receiving SNR, this method is also SNR-related and is computationally complex.

An SNR-independent polarization weight (PW) method is disclosed in R1-1611254, "Details of the Polar Code Design", Huawei & HiSilicon, 3GPP TSG RAN WG1 Meeting #87. In this method, the reliability of a sub-channel is measured by the corresponding beta-expansion values, which are given by a closed-form formula as a function of the binary representation of the sub-channel index. The reliability measure is SNR-independent, and can lead to a single nested ordered sub-channel sequence for different coding rates and block lengths. The sequence may be calculated offline and stored in memory for use, to provide a lower implementation and computational complexity relative to other methods.

As mentioned above, there are several ways to generate an ordered sequence (from a kernel and its generator matrix) via calculating the sub-channel reliabilities. Not every way might necessarily lead to a nested sequence, and this nested sequence might not necessarily be unique. Nested ordered sequences could be generated, for example, based on a polarization weight as disclosed in Chinese Patent Application No. CN 201610619696.5, filed on Jul. 29, 2016, or based on a Hamming weight as disclosed in U.S. Patent Application No. 62/438,565, filed on Dec. 23, 2016, both of which are entirely incorporated herein by reference. Other techniques could also or instead be used.

Ordered sequence computations can be performed in a number of different ways. For example, the computations could be performed online, producing ordered sequences that can be dynamically adjusted or recomputed based on, for example, observed channel conditions. The computations may alternatively be performed off line (i.e. in advance) to produce pre-computed (and static) ordered sequences that can be stored and retrieved during subsequent coding operations. In yet another alternative, the computations may be performed partially online and partially offline.

In mobile wireless communications, the channel conditions may significantly vary in time. It may be impractical to use online sequence computing methods with high computational complexity (e.g. genie-aided, DE and GA-based methods) because those methods may consume significant communication bandwidth and processing resources. Computationally complex methods, such as Genie-aided, DE and/or GA-based methods, are generally performed offline instead to produce multiple static ordered sequences, for example, by fixing a working SNR or reference SNR for different combinations of code length and code rate. However, simple online sequence generation methods such as those disclosed in U.S. Patent Application No. 62/463,128 entitled "APPARATUS AND METHODS OF SPECIFYING ORDERED SEQUENCES OF CODING SUB-CHANNELS" filed on Feb. 24, 2017 and incorporated herein by reference in its entirety may still be preferred, in that they generally consume less memory, and may be more flexible and adaptive to time-varying wireless channel conditions.

An Arikan code has been adopted for 5G NR control channel coding, as mentioned above. The selected code has better coding performance (about 2.0 dB gain) over TBCC for small block sizes.

An Arikan polar code with code length $N=2^n$ and a binary kernel $$F = \begin{bmatrix} 1 & 0 \\ 1 & 1 \end{bmatrix}$$

as described by way of example above is a linear block code generated by the row space of the generator matrix:

$$G_N = \begin{bmatrix} G_{N/2} & 0 \\ G_{N/2} & G_{N/2} \end{bmatrix}.$$

Let A be a set of size K containing a subset of row indices of $G_N$. This set could be referred to as the information set. The complementary set of size N−K could be referred to as the frozen set. Let u=[$u_1, \ldots, u_N$] be an input bit vector. To encode a set of K information bits, the information bits are placed into those elements of u corresponding to the set A, and deterministic zero-valued (or other known-valued) bits are placed into the remaining elements. A codeword c=[$c_1, \ldots, c_N$] is then calculated as $$c = uG_N.$$

Different decoding algorithms for Arikan polar codes are also described by way of example above. SC decoding is the simplest under which the capacity achieving property of polar codes is proven. Although polar codes are capacity-achieving under SC decoding, their performance at finite code length is not as promising. SCL decoding may improve performance at finite code length. CA-SCL decoding algorithms are also proposed for polar codes. Polar codes with CA-SCL decoding have emerged as strong competitors to Turbo and Low Density Parity Check (LDPC) codes.

The decoding complexity and latency of an Arikan polar code is directly related to list size of an SCL decoding implementation. The $3^{rd}$ Generation Partnership Project (3GPP) has assumed a maximum List size of 8 by allocating 3 extra CRC bits to guarantee a False-Alarm-Rate (FAR), of the NR-PDCCH channel, that is equal to a limitation on coding performance by a List-8 decoder.

The limitation is due primarily to the complexity and latency penalty paid for ranking L survivors from 2L candidate paths at each information bit. Complexity is O(2LK log(2L)) where L is list size and K is the number of information bits. Moreover, an SC-based decoder does not actually process information bits until L survival candidates are selected from the 2L candidates during decoding of any particular bit.

Due to this limitation, an Arikan polar code is proposed only for small blocks (smaller K) and is assumed to use an L<=8 decoder in current 5G NR standardization.

One solution to further enhance coding gain without increasing list size is to optimize an encoder. Encoder optimization could focus, for example, on a kernel in an effort to increase polarization, and/or on bit allocation for a rate-matching scheme in an effort to decrease the performance penalty associated with SCL decoding. However, any change to a polarization kernel would fundamentally reshape characteristics of a polar code, especially reliability distributions that are strongly relevant to allocation of K information bits on the K most reliable bit positions according to a rate-matching scheme. Some embodiments therefore relate to an optimization of the polarization kernel and its dynamic bit allocation.

The present disclosure contemplates "chained" polar coding, which is also referred to as "convolutional" polar coding in A. J. Ferrus, C. Hirche and D. Poulin, "Convolutional polar codes", arXiv:1704.00715.

Representations of the generator matrix of a chained polar code are given in the paper by Ferrus et al. The present disclosure is not dependent up on any specific generator matrix representation.

Figure 6:
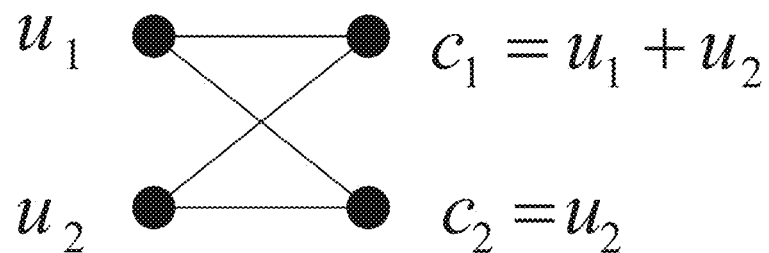
FIG. 6 is an example graph representation of a butterfly operation corresponding to a 2-by-2 Arikan kernel.
Figure 7:
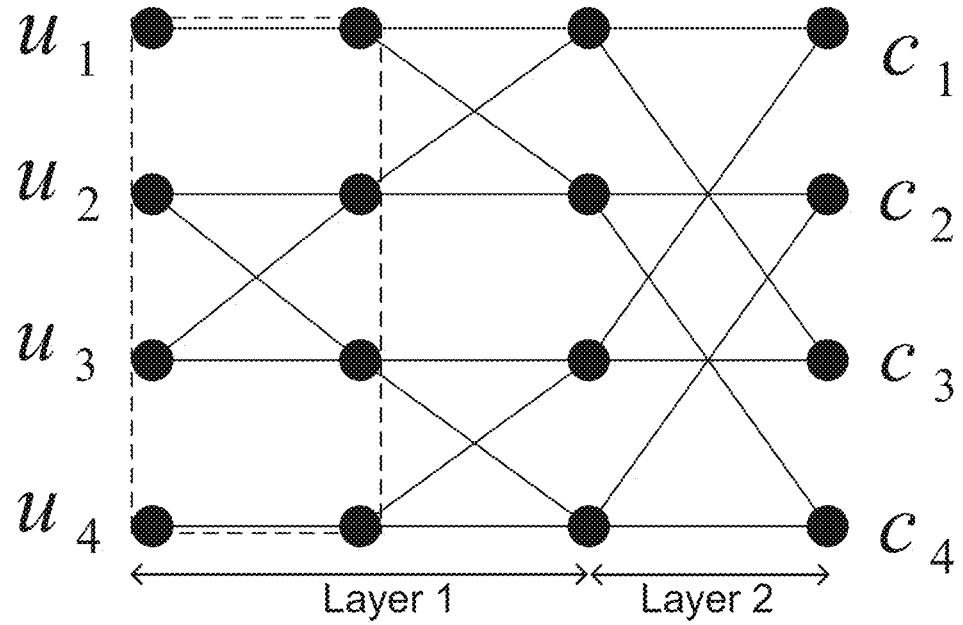
FIGS. 7-11 illustrate example coding graphs of chained polar codes of lengths 4, 8, 16, 32 and 64, respectively.
Figure 8:
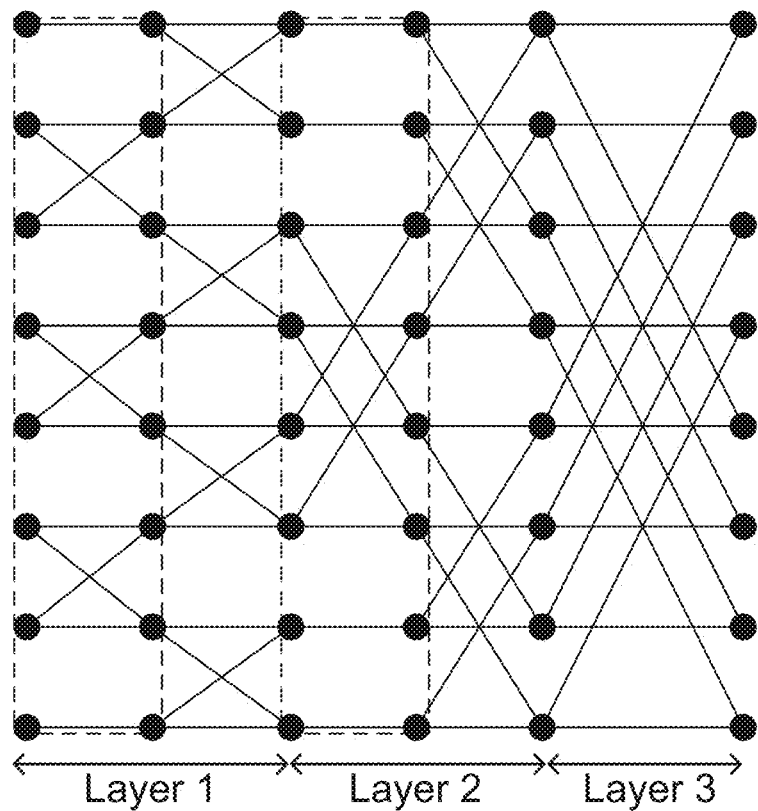
Figure 9:
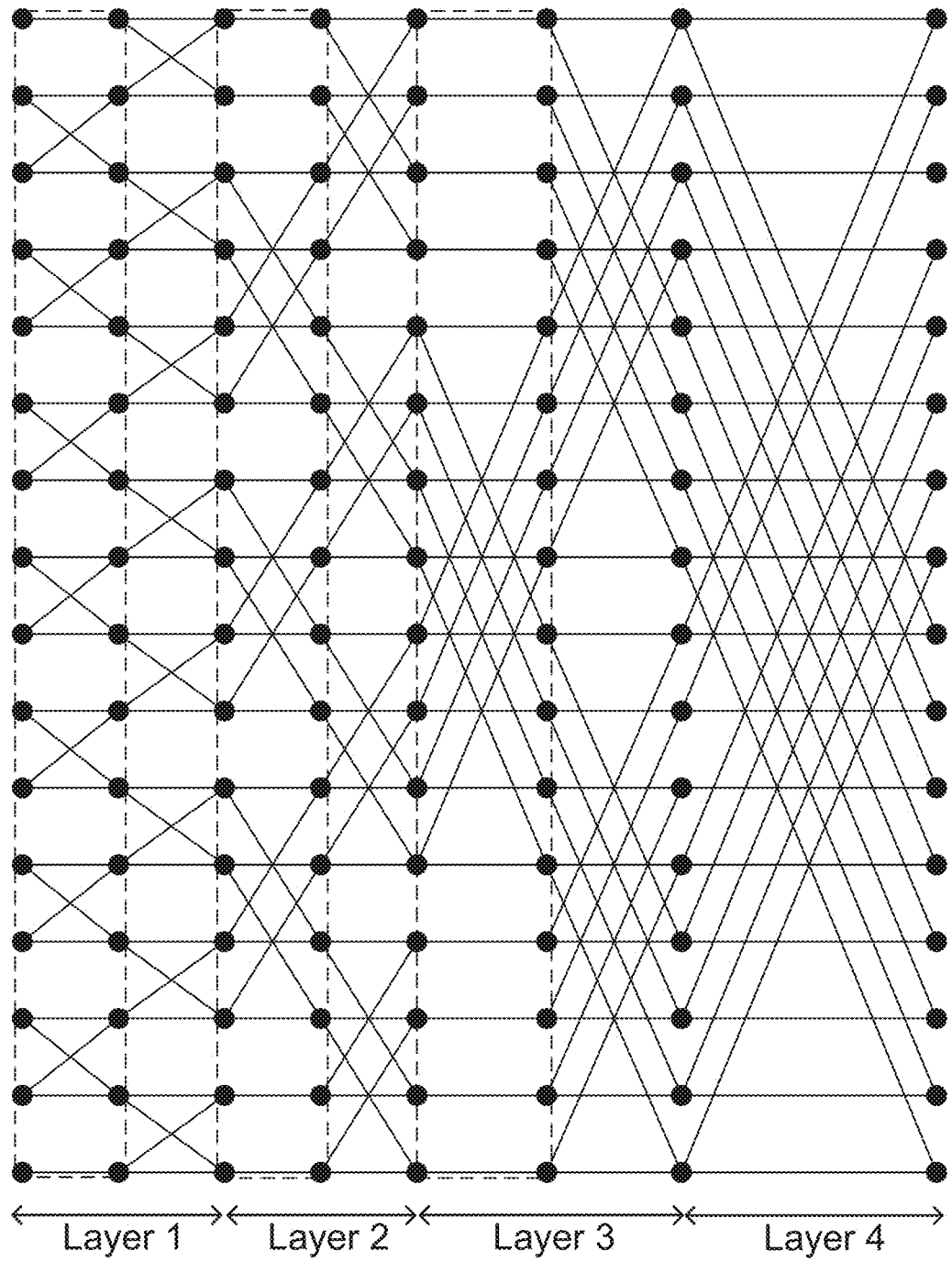
Figure 10:
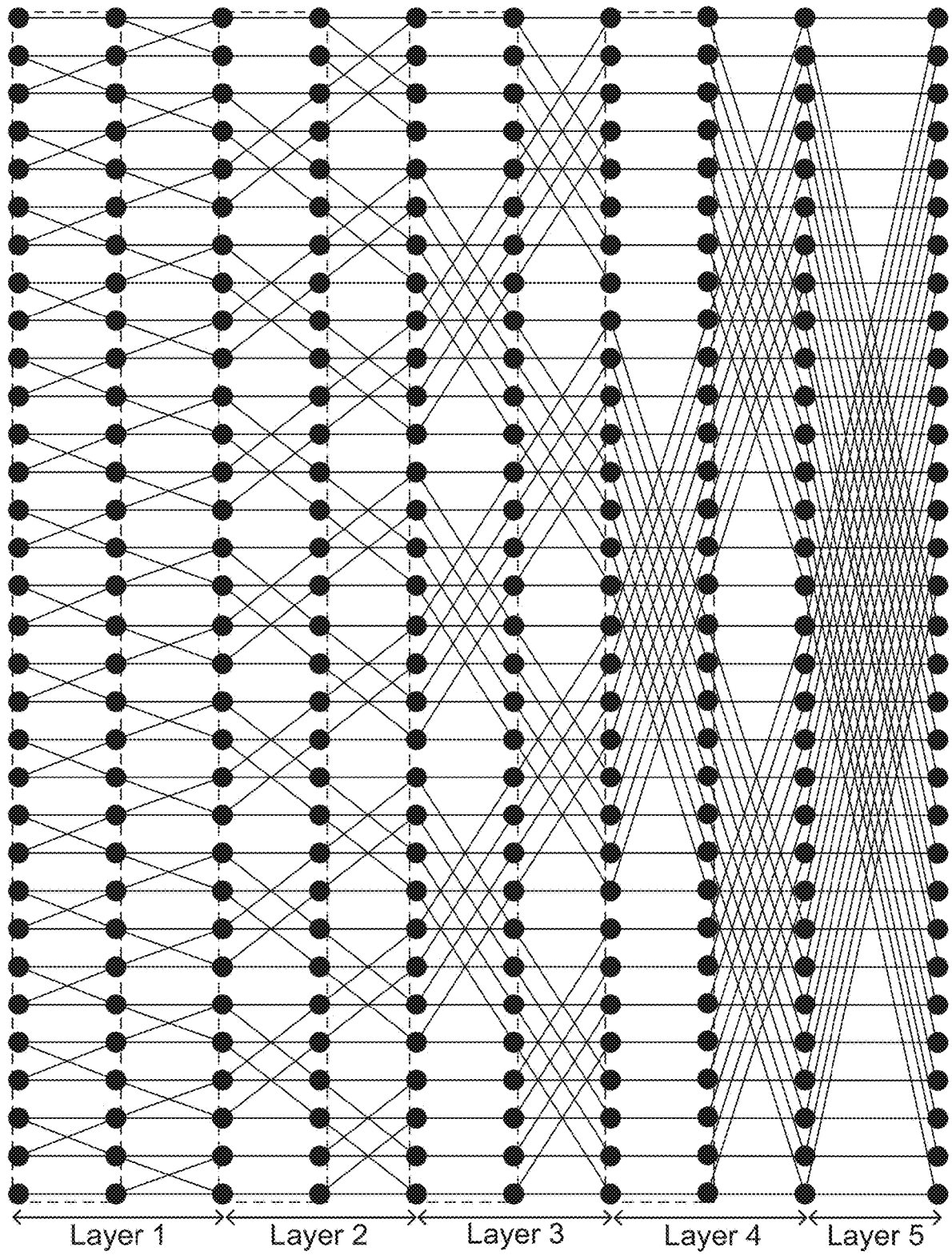
Figure 11:
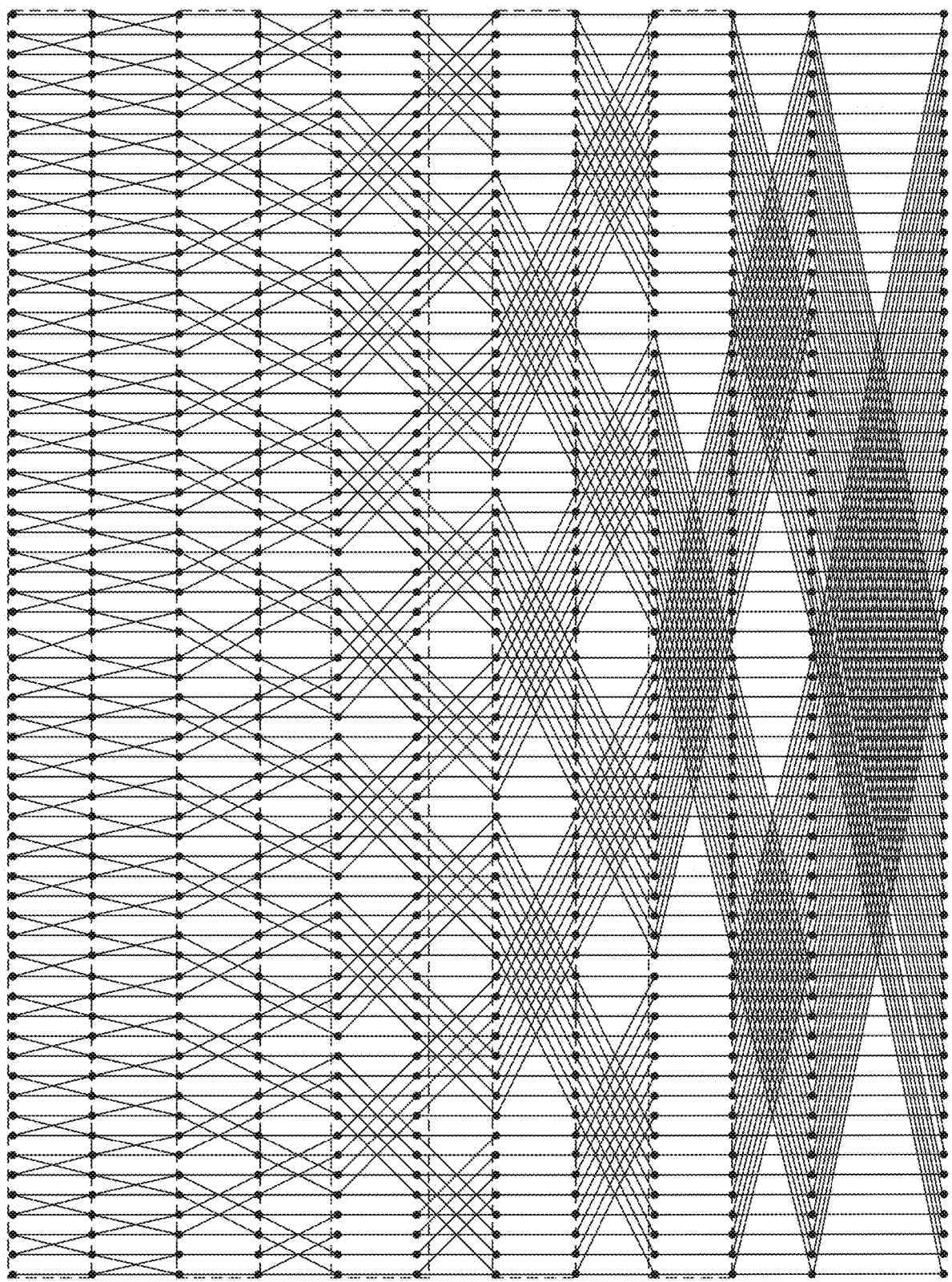

Kernel optimization in chained polar coding could be described in a graphical form by modifying a graph representation of an Arikan polar code to chain so-called "butterfly" shapes representing the 2×2 kernel $$F = \begin{bmatrix} 1 & 0 \\ 1 & 1 \end{bmatrix}$$

to each other. An example graph representation of a butterfly operation corresponding to a 2-by-2 Arikan kernel F is shown in FIG. 6.

A chained polar code encodes an input vector or block u=[$u_1, u_2 \ldots, u_N$] using n=$\log_2$ N encoding layers or stages, which are numbered from 1 to n in an embodiment. The encoding layers could be obtained, for example, by starting with encoding layers of a polar code and adding butterflies at the inputs of the layers such that they tie together two adjacent butterflies. For layer i, the first $2^{i-1}$ and the last $2^{i-1}$ bits are only copied to the input of the polar encoding layer. This operation is performed for all encoding layers except the last layer.

FIGS. 7-11 illustrate example coding graphs of chained polar codes of lengths 4, 8, 16, 32 and 64, respectively. The parts of these graphs within dashed lines are additional parts which, if removed, will provide graphs of Arikan polar codes.

These graphic representations illustrate that the number interconnections between bit positions is increased comparing to Arikan polar codes, including interconnections between bit positions in the upper half of each graph and those in the lower half of each graph, by layering several sets of interlocked kernels. Polarization is strengthened relative to an Arikan polar code. In fact, the exponent value of a chained polar code is much greater than that of an Arikan polar code, which is ½. Exponent value is indicative of polarization, with a higher exponent value indicating a higher degree of polarization.

Figure 12:
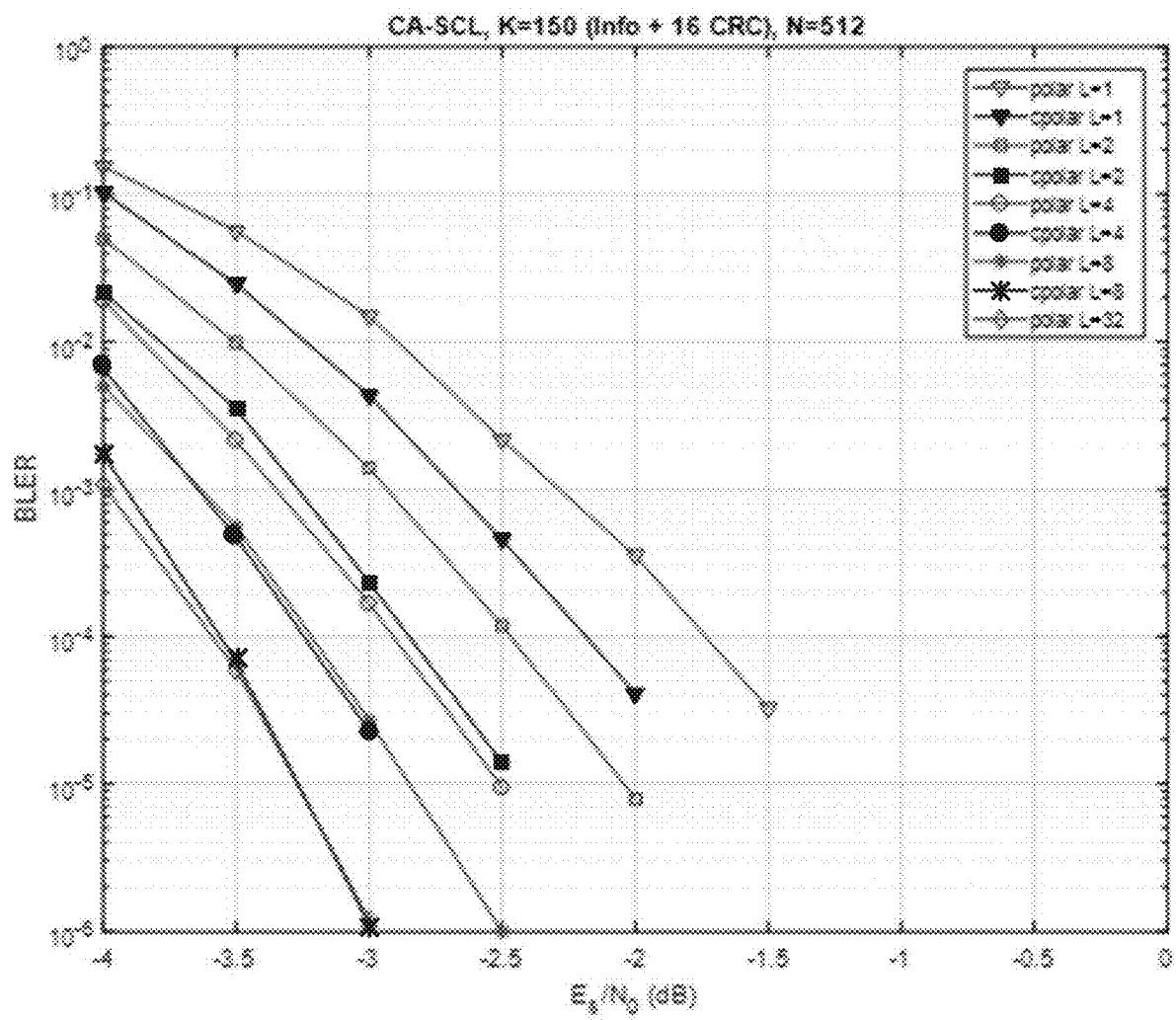
FIG. 12 is a plot of performance results from simulations.

Simulations show significant performance gain versus Arikan polar code for the same list sizes. FIG. 12 is a plot of performance results from simulations, for Arikan polar codes and chained polar codes (labeled as "cpolar" in FIG. 12). Simulation conditions are listed in FIG. 12. Similar or different results might be observed under different simulation conditions, and/or under similar or different operating conditions.

A dynamic bit allocation for an Arikan polar code is proposed in U.S. Provisional Patent Application No. 62/500, 799, entitled "POLAR CODE ONSTRUCTION WITH SHORT RELIABILITY SEQUENCE AND PUNCTURING OR SHORTENING", filed on May 3, 2017, and incorporated in its entirety herein by reference. That dynamic bit allocation is based on the fact that an N-sized Arikan polar code can be divided into two N/2-sized Arikan polar codes and that the bit allocation positions of (K,N) consist of the bit allocations (K1, N/2) and (K2, N/2), where K=K1+K2 and K1/K2 reflects the reliability that is changed due to coded bits that are to be reduced by a rate-matching scheme. Similarly, (K1,N/2) can be further divided into two N/4 polar codes. For each division from N to N/2, the reduced coded bits and their pattern are considered. This method could work seamlessly with any coded-bit-reduced-pattern.

Figure 13:
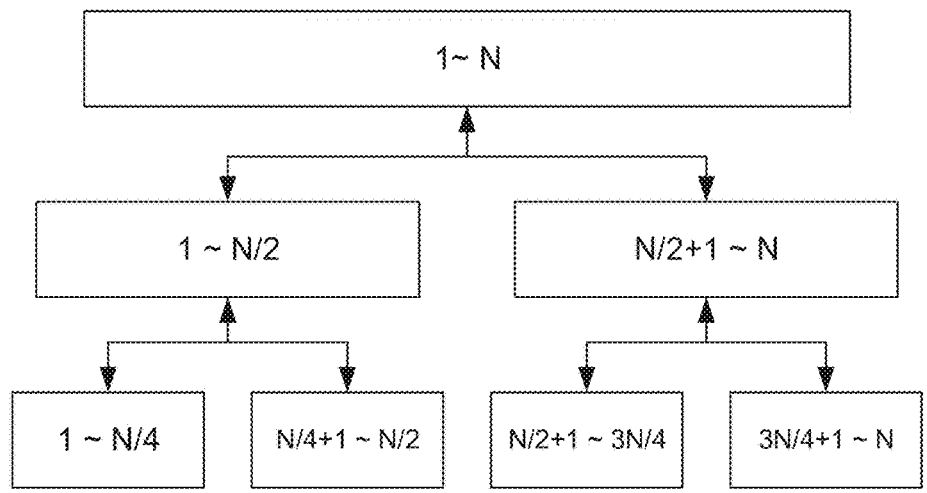
FIG. 13 is a block diagram illustrating input bit decomposition from N to N/2 and from N/2 to N/4 in an Arikan polar code.

This dynamic bit allocation could significantly reduce computation complexity and latency with a comparable coding performance in Arikan code. Another potential advantage of a dynamic bit allocation is to use a short ordered sequence to generate a bit allocation for larger N. As in the example above, the bit allocation of (K,N) could be turned into bit allocations of 4×N/4 smaller polar codes. This is shown by way of example in FIG. 13, which is a block diagram illustrating input bit decomposition from N to N/2 and from N/2 to N/4 in an Arikan polar code.

In a chained polar code, the input bits of upper and lower halves of an input vector are interlocked much more closely than in an Arikan polar code. This may bring about coding gain as shown above and in FIG. 12, but could also reshape sub-channel reliability distribution. A simple decomposition from a length N polar code to 2×N/2 polar codes as in an Arikan polar code does not work for a chained polar code.

According to an embodiment, the last 2 encoding layers are removed from a length N chained polar code, and the length N chained polar code is then divided into three length N/2 chained polar sub-codes with overlapping between sub-codes.

Figure 14:
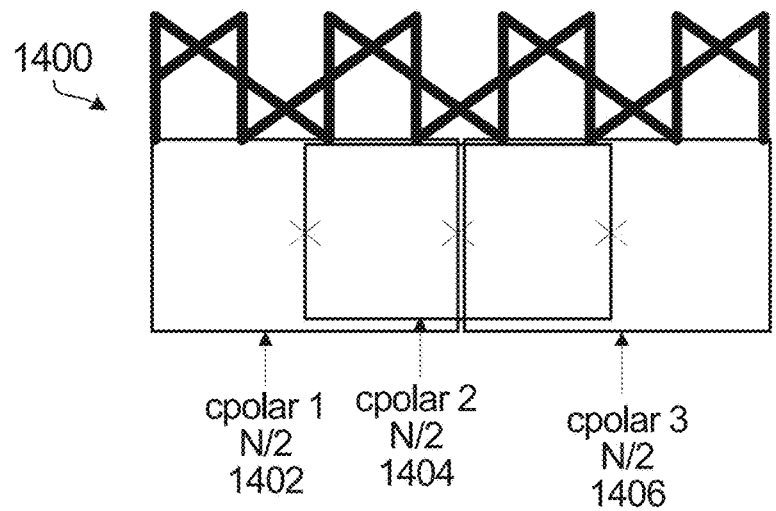
FIG. 14 is a block diagram illustrating input bit decomposition from N to N/2 in a chained polar code.

FIG. 14 is a block diagram illustrating input bit decomposition from N to N/2 in a chained polar code. The example shown in FIG. 14 represents a chained polar code 1400 of length N, consisting of three chained polar sub-codes or constituent codes 1402, 1404, 1406 of length N/2. The chained polar sub-codes 1402, 1404, 1406 overlap, or in other words share some portion of the graph 1400 of the larger length N chained polar code. The chained polar sub-codes 1402, 1404, 1406 are also connected to each other using interconnecting butterflies that are shown by the cross signs in FIG. 14.

Figure 15:
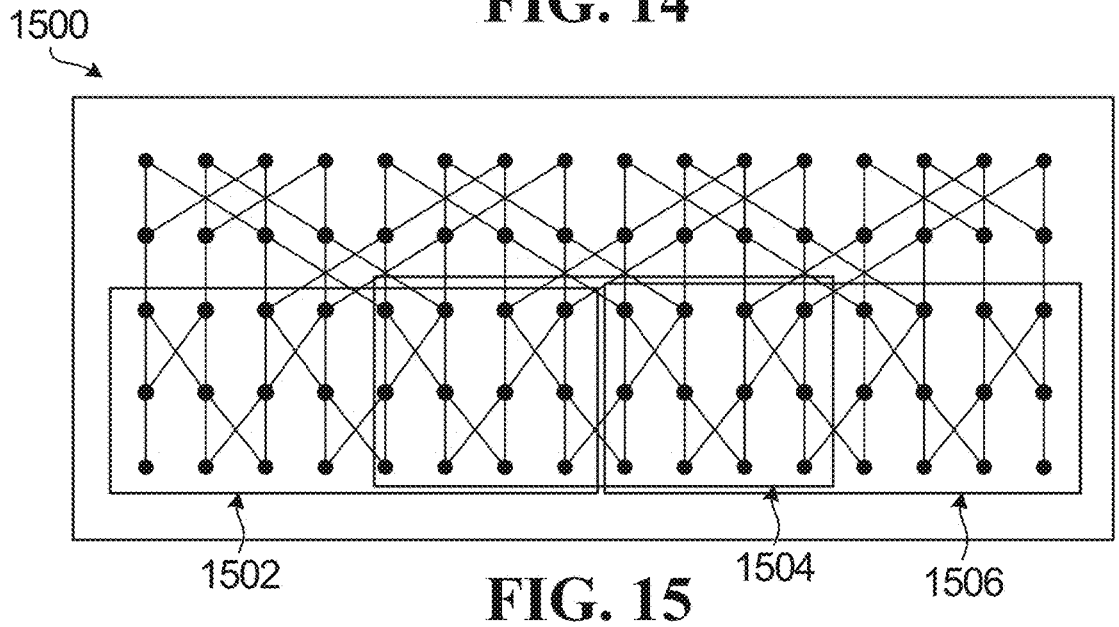
FIG. 15 is a graph representation illustrating input bit decomposition from N=16 to N/2=8 in a chained polar code.

FIG. 15 is a graph representation illustrating input bit decomposition from N=16 to N/2=8 in a chained polar code. The graph representation in FIG. 15 is a specific example of the type of decomposition shown in FIG. 14. The graph 1500 represents a length N=16 chained polar code with three length N/2=8 overlapping chained polar sub-codes 1502, 1504, 1506.

The reason to have three overlapping length N/2 chained polar sub-codes instead of just two length N/2 polar sub-codes as in the case of an Arikan polar code can perhaps best be explained from the point of view of an SC decoder and the graph representation of FIG. 15. Consider an example of an SC decoder decoding original input bits u[1~N] based on 4-bit LLRs at the last column of a decoding graph. In the graph representation of FIG. 15, for decoding received bits, LLRs would be inputs at the top row of nodes and decoded bits u[1~16] would be outputs from the bottom row of nodes. The first (3N/8−1) bits can be decoded using only the LLRs at the "output" nodes (in an encoding sense) of the first chained polar sub-code 1502 of length N/2. This is also shown at 1402 in FIG. 14. Once the first (3N/8−1) bits have been decoded, the subsequent N/4 bits can be decoded using the LLRs at the "output" nodes of the second chained polar sub-code 1504, also shown at 1404 in FIG. 14, and finally the last 3N/8+1 bits can be decoded using the LLRs calculated on the "output" nodes of the third chained polar sub-code 1506, also shown at 1406 in FIG. 14.

Now consider dynamic allocation of K information bits among N bit positions to generate u[1~N] based on this type of decomposition for a chained polar code. One example of input bit decomposition from N to N/2 is to divide bit positions or sub-channels u[1~N] into three subsets, blocks, or "chunks", including $$u\left[1 \sim \frac{3N}{8} - 1\right], u\left[\frac{3N}{8} \sim \frac{5N}{8} - 1\right], \text{ and } u\left[\frac{5N}{8} \sim N\right].$$

Let $K_1$, $K_2$ and $K_3$ denote the number of information bits allocated to each subset, i.e.

$$u\left[1 \sim \frac{3N}{8} - 1\right], u\left[\frac{3N}{8} \sim \frac{5N}{8} - 1\right], \text{ and } u\left[\frac{5N}{8} \sim N\right]$$

respectively. Then the first chained polar sub-code $$\left(u\left[1 \sim \frac{3N}{8} - 1\right]\right)$$

has an equivalent channel capacity $C_1$; the second one $$\left(u\left[\frac{3N}{8} \sim \frac{5N}{8} - 1\right]\right)$$

has an equivalent channel capacity $C_2$; and the third one $$\left(u\left[\frac{5N}{8} \sim N\right]\right)$$

has an equivalent channel capacity $C_3$. All of these channel capacities $C_i$ can be obtained in terms of (K, N) or a rate-matched or otherwise reduced code length M. A reduced number of coded bits (both bit position indices and number) due to puncturing and/or shortening for rate matching for example, would affect $C_i$. The equivalent channel capacities $C_i$ could instead be derived taking into account the indices and number (N−M) of reduced coded bits for rate matching. If $C_1+C_2+C_3=C$ (C is the equivalent channel capacity of the input channel) and $K_i$ is chosen according to the channel capacity $C_i$, then $K_1+K_2+K_3=K$.

Similarly, one length N chained polar code could be decomposed into 7 overlapping length N/4 chained polar sub-codes. To be more general, given a target sub-code length $N_{ref}$, a length N chained polar can be decomposed into $$\frac{2N}{N_{ref}} - 1$$

overlapping chained polar sub-codes. Accordingly, u[1~N] can be divided into an number $$\frac{2N}{N_{ref}} - 1$$

of subsets, blocks, or chunks. After the bit allocation $K_i$ for each subset is determined, a reliability sequence of length $N_{ref}$ can be used to obtain bit positions for the information bits within each subset, and then these bit positions from each subset are combined together to provide a total of K bit positions.

A detailed code design example according to one illustrative embodiment is provided below.

In this example, N, K, $N_{ref}$, $Q_{ref}$, and input capacity or rate C are provided as inputs or are otherwise available, and an information set A of size K is generated as an output:

1) Set a number of component codes or sub-codes $$n_c = \frac{2N}{N_{ref}} - 1$$

2) Set an information set of each component code as a null set having no members, $A_i=0$, $i=1, \ldots, n_c$
3) Determine rate or capacity allocations: $C_i = f^{(i)}(C)$, for $i=1:n_c$
4) Determine information bit allocations $$K_1 = \left(\frac{3N_{ref}}{4} - 1\right)C_1, K_i = \frac{N_{ref}}{2}C_i,$$

$$\forall i = 2, \ldots n_c - 1, \text{ and } K_{n_c} = K - \sum_{j=2}^{n_c-1} K_j$$

5) Determine information sets of the component codes:

Code 1: Determine $A_1$ consisting of indices of $K_1$ most reliable bit positions from ordered reliability sequence $Q_{ref}$ such that the indices are less than or equal to $$\frac{3N_{ref}}{4} - 1$$

Code(s), $2 \leq i \leq n_c - 1$: Determine $A_i$ consisting of indices of $K_i$ most reliable bit positions from $Q_{ref}$ such that the indices are greater than or equal to $$\frac{N_{ref}}{4}$$

and less than $$\frac{3N_{ref}}{4}$$

Code $n_c$: Determine $A_{n_c}$ consisting of indices of $K_{n_c}$ most reliable bit positions from $Q_{ref}$ such that the indices are greater than or equal to $$\frac{N_{ref}}{4}$$

6) Determine the full information set A as a union of the component code information sets, with adjusted offset indices:

$$A = \bigcup_{i=1}^{n_c} \left(A_i + \frac{(i-1)N_{ref}}{2}\right)$$

The rate or capacity allocation functions $f^{(i)}(C)$ could be obtained, for example, by calculating the theoretical information capacity of the bit-channels for each individual component code given K and either N or M (N could be derived from K and M). It may, however, be more practical to resort to approximation methods. Numerical methods could be used to fit approximating curves to these functions. Polynomial functions could be used to approximate $f^{(i)}(C)$, for example:

$$f^{(i)}(C) = \sum_{j=0}^{D} \alpha_j^{(i)} C^j,$$

where D is the degree of the polynomial that is used to approximate $f^{(i)}(C)$ and $\alpha_j^{(i)}$ represents the coefficients of the polynomial. A choice of D=2, as an example, would be a degree-2 polynomial. Small values of D, such as D≤5, may suffice to perform code construction. In general, $f^{(i)}(C)$ could be approximated using a polynomial, for which parameters $\alpha_j^{(i)}$ and D are set or determined.

In another embodiment, $f^{(i)}(C)$ could be pre-computed and stored in tables in memory, for different values of parameters such as (K, M) for example. Tables in memory could also or instead be populated with some numerical approximation of $f^{(i)}(C)$.

Figure 16A:
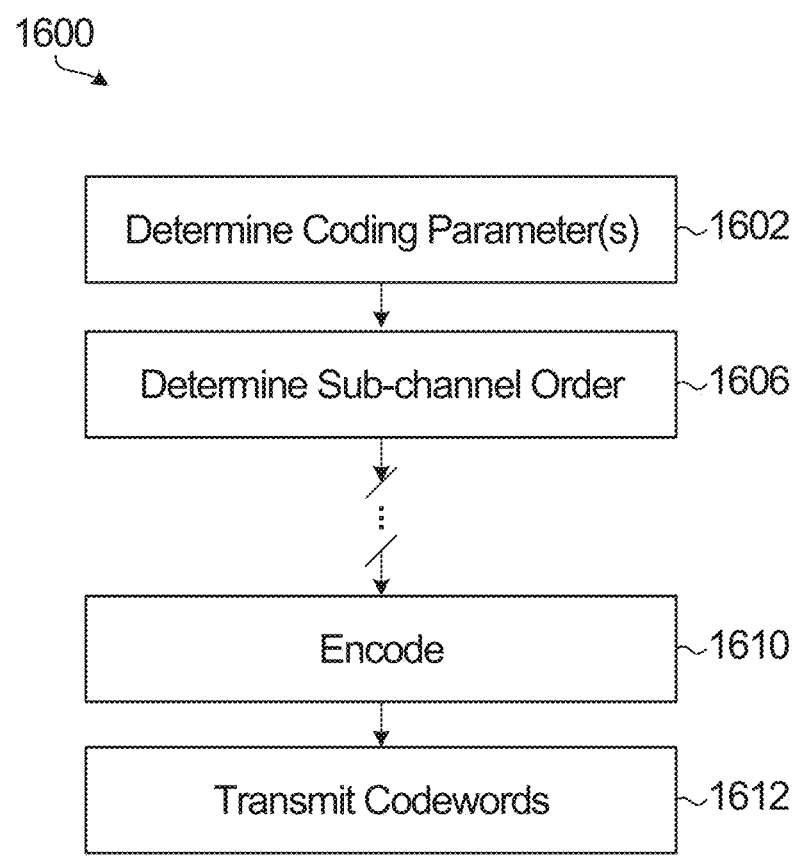
FIG. 16A is a flow diagram of an example coding method according to an embodiment.

FIG. 16A is a flow diagram of an example coding method according to an embodiment. The illustrated example method 1600 includes determining one or more coding parameters at 1602. The coding parameter(s) could include, for example, N, K, $N_{ref}$, $Q_{ref}$, and C as in the detailed example above. One or more of the coding parameters could be read from memory or otherwise provided. Some parameters, such as code length N, could be computed based on a given K and a given code rate R, for example. At 1606, a reliability order of sub-channels is determined. A rule set could be used to reduce the number of reliability computations and polynomial comparisons that are involved in determining sub-channel order at 1606, for example, which could make it feasible to determine sub-channel order online when information is to be encoded or decoded. One or more reliability orders could be pre-computed and stored in memory, and accessed at 1606 when needed for encoding.

An ordered sub-channel sequence as determined at 1606 could be used to select information sub-channels, frozen sub-channels, and/or other types of sub-channels when information is to be encoded at 1610. As disclosed herein, an ordered sub-channel sequence that is shorter than a full code length N could be used to determine the bit positions or sub-channels that are to be used for information bits, frozen bits, and/or other types of bits. Codewords are then transmitted at 1612.

The example method in FIG. 16A is intended for illustrative purposes. Other embodiments could involve performing the illustrated operations in any of various ways, performing fewer or additional operations, and/or varying the order in which operations are performed.

Figure 16B:
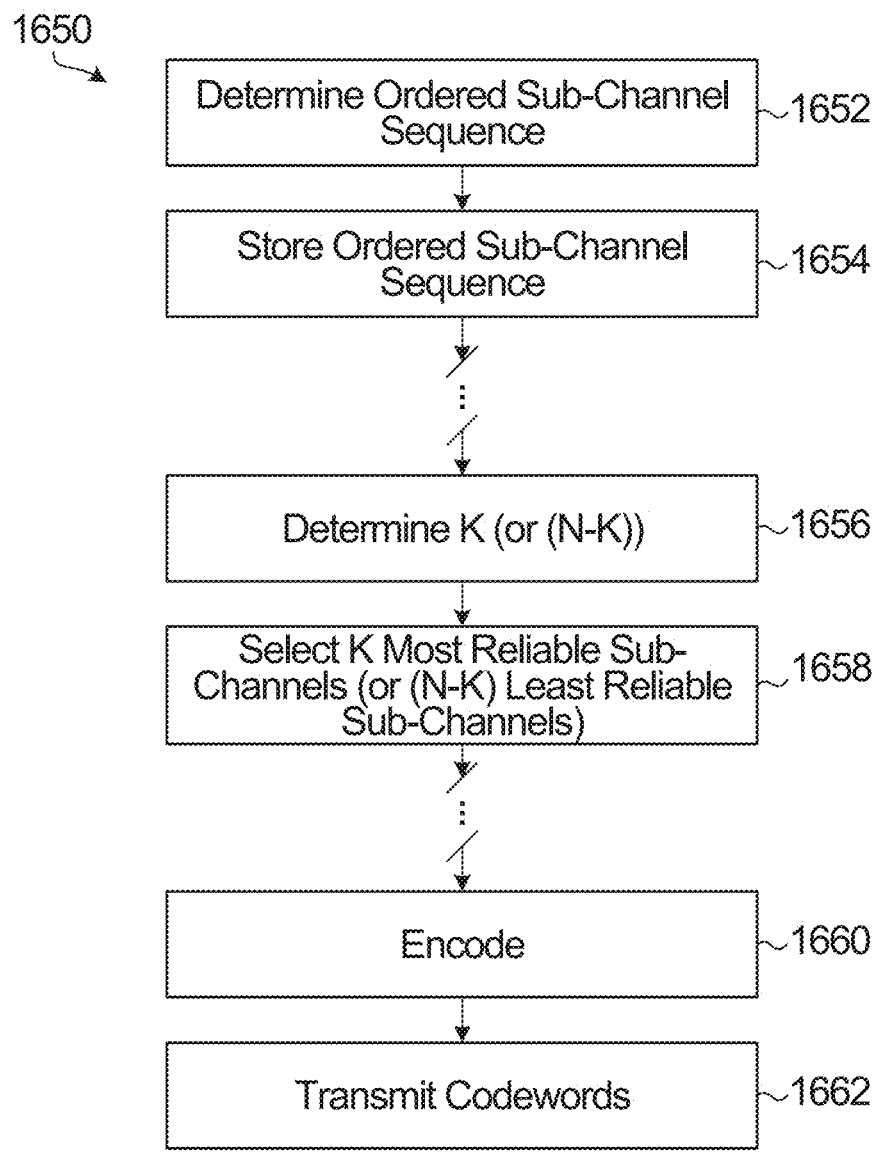
FIG. 16B is a flow diagram of an example coding method according to a further embodiment.

FIG. 16B is a flow diagram of an example of such a coding method 1650 according to a further embodiment. The example method 1650 involves determining an ordered sequence of sub-channels at 1652 and storing the determined ordered sub-channel sequence at 1654. In some implementations, these steps may be optional and/or performed in advance, separately from other coding operations in coding method 1650. For example, the coding method 1650 may instead simply include determining an ordered sub-channel sequence at 1652 by retrieving or reading the stored the ordered sub-channel sequence from memory. Other possibilities exist.

One or more coding parameters, which could include K or (N−K) depending on the type of sub-channels to be selected, is determined at 1656, and examples of operations that could be involved in determining K or (N−K) are described herein. At 1658, K most reliable sub-channels, or (N−K) least reliable sub-channels, of the N sub-channels are selected.

The encoding at 1660 involves encoding input bits onto the K most reliable sub-channels, according to the selection at 1658. Codewords that are generated by the encoding at 1660 are transmitted at 1662.

The example method 1650 is intended for illustrative purposes. Other embodiments could involve performing the illustrated operations in any of various ways, performing fewer or additional operations, and/or varying the order in which operations are performed. Other variations could be or become apparent to a skilled person based on the present disclosure.

Figure 17:
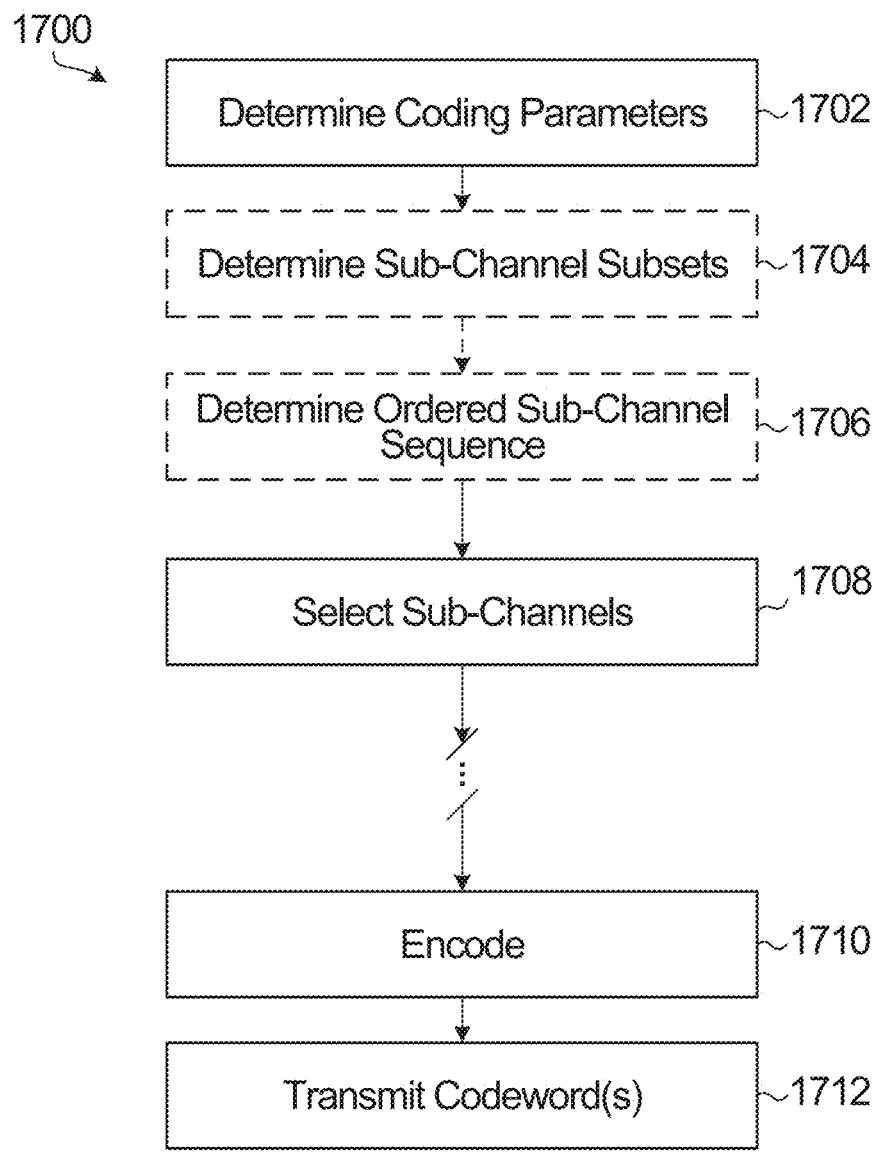
FIG. 17 is a flow diagram of an example coding method according to yet another embodiment.

FIGS. 16A, 16B illustrate general examples of coding methods. FIG. 17 is a flow diagram of an example coding method according to yet another embodiment.

The example method 1700 includes determining one or more coding parameters at 1702, such as N, K, $N_{ref}$, $Q_{ref}$ and C as in a detailed example above. Coding parameters could be read from memory, computed, or otherwise provided. Subsets of sub-channels that are provided by a length N polar code are determined at 1704. The subsets include sub-channels associated with respective overlapping constituent polar codes of the length N polar code, and the constituent polar codes being of length $N_{ref} < N$. At 1706, an ordered sequence of length $N_{ref}$, representing a reliability order of sub-channels, is determined. Either or both of the operations at 1704 and 1706 could be performed when information is to be encoded or decoded, or performed in advance. Sub-channel subsets for different coding parameters, and/or different length reliability sequences could be pre-computed and stored in memory, and accessed at 1704, 1706 when needed for encoding, for example.

An ordered sub-channel sequence as determined at 1706 could be used at 1708 in selecting, from each of the subsets, a sub-channel to carry an information bit in input bits that are to be encoded. As disclosed herein, an ordered sub-channel sequence that is shorter than a full code length N could be used to determine the bit positions or sub-channels that are to be used for information bits, frozen bits, and/or other types of bits. Input bits are encoded at 1710 to generate a codeword, and the codeword may then be transmitted at 1712. Multiple codewords could be generated and transmitted at 1710, 1712.

The example method 1700, like the other example methods 1600, 1650 in FIGS. 16A, 16B, is intended for illustrative purposes. Other embodiments could involve performing the illustrated operations in any of various ways, performing fewer or additional operations, and/or varying the order in which operations are performed. Other variations could be or become apparent to a skilled person based on the present disclosure. For example, any one or more of the following could be provided, alone or in any of various combinations, in embodiments:

the constituent polar codes include $$\frac{2N}{N_{ref}} - 1$$

constituent polar codes;

the selecting involves selecting the sub-channel from each of the subsets based on an ordered sub-channel reliability sequence $Q_{ref}$ of length $N_{ref}$;

the selecting involves selecting, from an $i^{th}$ subset of the plurality of subsets, a number $K_i$ of sub-channels, wherein $K_i$ is based on an equivalent channel capacity $C_i$ of the constituent polar code with which the $i^{th}$ subset is associated;

$C_i = f^{(i)}(C)$, where $f^{(i)}$ is a capacity allocation function and C is an input capacity of the polar code;

the constituent polar codes include $n_c$ constituent polar codes;

the length N polar code is an (N, K) polar code, wherein $$K_1 = \left(\frac{3N_{ref}}{4} - 1\right)C_1, K_i = \frac{N_{ref}}{2}C_i, \forall i = 2, \ldots n_c - 1, \text{ and}$$

$$K_{n_c} = K - \sum_{j=2}^{n_c - 1} K_j;$$

the selecting involves: selecting an information set $A_1$ comprising indices of $K_1$ most reliable sub-channels from $Q_{ref}$ such that the $K_1$ indices are less than or equal to $$\frac{3N_{ref}}{4} - 1;$$

selecting an information set $A_i$, for $2 \leq i \leq n_c - 1$, comprising indices of $K_i$ most reliable sub-channels from $Q_{ref}$ such that the $K_i$ indices are greater than or equal to $$\frac{N_{ref}}{4}$$

and less than $$\frac{3N_{ref}}{4};$$

selecting an information set $A_{n_c}$ comprising indices of $K_{n_c}$ most reliable sub-channels from $Q_{ref}$ such that the $K_{n_c}$ indices are greater than or equal to $$\frac{N_{ref}}{4};$$

the method also involves determining a full information set A as a union of the selected information sets with adjusted offset indices:

$$A = \bigcup_{i=1}^{n_c} \left(A_i + \frac{(i-1)N_{ref}}{2}\right);$$

each of the subsets includes fewer than $N_{ref}$ sub-channels.

Although FIGS. 16A, 16B, 17 show example operations that would be performed at an encoder (or transmitter), other embodiments could be implemented at a decoder (or receiver). A word that is based on a codeword of a code could be received at a receiver and decoded, based on sub-channels that are selected by the decoder, a sub-channel selector coupled to the decoder, or a processor in a processor-based embodiment, according to a method as shown in any of FIGS. 16A, 16B, 17 and/or as otherwise disclosed herein.

In another embodiment, a non-transitory processor-readable medium stores instructions which, when executed by one or more processors, cause the one or more processors to perform a method as disclosed herein.

Figure 18:
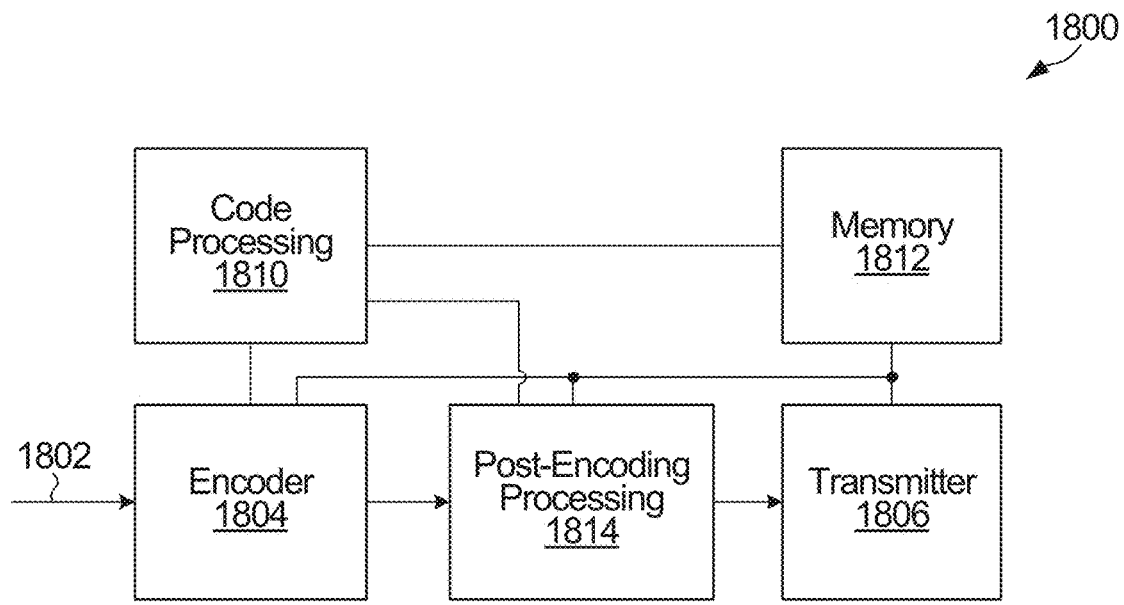
FIG. 18 is a block diagram of an example apparatus for encoding and transmitting codewords.

FIG. 18 is a block diagram of an example apparatus for encoding and transmitting codewords. The apparatus 1800 includes an encoder module 1804 coupled to a transmitter module 1806. The apparatus 1800 also includes a code processing module 1810 coupled to the encoder module 1804 and a post-encoding processing module 1814. The post-encoding processing module 1814 is also coupled to the encoder module 1804 and to the transmitter module 1806. A memory 1812, also shown in FIG. 18, is coupled to the encoder module 1804, to the code processing module 1810, to the post-encoding processing module 1814, and to the transmitter module 1806. Although not shown, the transmitter module 1806 could include a modulator, an amplifier, antenna and/or other modules or components of a transmit chain or alternatively could be configured to interface with a separate (Radio-Frequency, RF) transmission module. For example, some of all of the modules 1804, 1806, 1810, 1812, 1814 of the apparatus 1800 may be implemented in hardware or circuitry (e.g. in one or more chipsets, microprocessors, Application-Specific Integrated Circuits (ASICs), Field-Programmable Gate Arrays (FPGAs), dedicated logic circuitry, or combinations thereof) so as to produce codewords as described herein for transmission by a separate (RF) unit.

In some embodiments, the memory 1812 is a non-transitory computer readable medium at 1812, that includes instructions for execution by a processor to implement and/or control operation of the code processing module 1810, the encoder module 1804, the post-encoding processing module 1814, the transmitter module 1806 in FIG. 18, and/or to otherwise control the execution of functionality and/or embodiments described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a compact disc read-only memory (CD-ROM), universal serial bus (USB) flash disk, or a removable hard disk, at 1812.

In some embodiments, the encoder module 1804 is implemented in circuitry, such as a processor, that is configured to encode input bits as disclosed herein. In a processor-based implementation of the encoder module 1804, processor-executable instructions to configure a processor to perform encoding operations are stored in a non-transitory processor-readable medium. The non-transitory medium could include, in the memory 1812 for example, one or more solid-state memory devices and/or memory devices with movable and possibly removable storage media.

The code processing module 1810 could be implemented in circuitry that is configured to determine coding parameters such as mother code block length, and to determine an ordered sub-channel sequence as disclosed herein. In some embodiments, the code processing module 1810 is implemented using a processor. The same processor or other circuitry, or separate processors or circuitry, could be used to implement both the encoder module 1804 and the code processing module 1810. As noted above for the encoder module 1804, in a processor-based implementation of the code processing module 1810, processor-executable instructions to configure a processor to perform code processing operations are stored in a non-transitory processor-readable medium, in the memory 1812 for example.

Like the encoder module 1804 and the code processing module 1810, the post-encoding processing module 1814 is implemented in circuitry, such as a processor, that is configured to perform various post-encoding operations. These post-encoding operations could include rate-matching operations such as puncturing, shortening and/or interleaving, for example. In a processor-based implementation of the post-encoding processing module 1814, processor-executable instructions to configure a processor to perform post-encoding operations are stored in a non-transitory processor-readable medium, examples of which are described above. In an embodiment, the post-encoding processing module 1814 derives a puncturing or shortening scheme from a puncturing or shortening scheme that is to be applied to a codeword prior to transmission. Information indicative of bit positions and/or sub-channels that are affected by post-encoding operations, or information from which such bit positions or sub-channels may be determined, may be fed back to the code processing module 1810, stored to the memory 1812, or otherwise made available to the code processing module 1810 by the post-encoding processing module 1814.

In some embodiments of the code processing module 1810, the coding parameters and/or the ordered sub-channel sequence may be determined based on information from the post-encoding processing module 1814. For instance, the ordered sub-channel sequence may be determined based on the rate-matching scheme determined by the post-encoding processing module 1814. Conversely, in some other embodiments, the post-encoding processing module 1814 may determine a rate-matching scheme based on the coding parameters and/or the ordered sub-channel sequence determined by the code processing module 1810. In yet some other embodiments, the determinations made within the code processing module 1810 and post-encoding processing module 1814 are jointly performed and optimized.

The encoder module 1804 is configured to receive input bits at 1802, to select, from each of multiple subsets of sub-channels that are provided by a length N polar code, a sub-channel to carry an information bit in the input bits that are to be encoded, and to encode the input bits to generate a codeword. As disclosed herein, the subsets include sub-channels associated with respective overlapping constituent polar codes of the length N polar code, and the constituent polar codes are of length $N_{ref}<N$. The transmitter module 1806 is coupled to the encoder module 1804, through the post-encoding processing module 1814 in the example shown, to transmit the codeword.

The encoder module 1804, other components of the example apparatus 1800, and/or a processor in a processor-based embodiment, could implement any of various other features that are disclosed herein. For example, any one or more of the following could be provided, alone or in any of various combinations, in embodiments:

the constituent polar codes include $$\frac{2N}{N_{ref}} - 1$$

constituent polar codes;

the encoder, a processor in a processor-based embodiment, or another component, is configured to select the sub-channel from each of the subsets based on an ordered sub-channel reliability sequence $Q_{ref}$ of length $N_{ref}$;

the encoder, a processor in a processor-based embodiment, or another component, is configured to select, from an $i^{th}$ subset of the plurality of subsets, a number $K_i$ of sub-channels, wherein $K_i$ is based on an equivalent channel capacity $C_i$ of the constituent polar code with which the $i^{th}$ subset is associated;

$C_i = f^{(i)}(C)$, where $f^{(i)}$ is a capacity allocation function and $C$ is an input capacity of the polar code;

the constituent polar codes include $n_c$ constituent polar codes;

the length N polar code is an (N, K) polar code, wherein $$K_1 = \left(\frac{3N_{ref}}{4} - 1\right)C_1, K_i = \frac{N_{ref}}{2}C_i, \forall i = 2, \ldots n_c - 1, \text{ and}$$

$$K_{n_c} = K - \sum_{j=2}^{n_c-1} K_j;$$

the encoder, a processor in a processor-based embodiment, or another component, is configured to: select an information set $A_1$ comprising indices of $K_1$ most reliable sub-channels from $Q_{ref}$ such that the $K_1$ indices are less than or equal to $$\frac{3N_{ref}}{4} - 1;$$

select an information set $A_i$, for $2 \leq i \leq n_c - 1$, comprising indices of $K_i$ most reliable sub-channels from $Q_{ref}$ such that the $K_i$ indices are greater than or equal to $$\frac{N_{ref}}{4}$$

and less than $$\frac{3N_{ref}}{4};$$

select an information set $A_{n_c}$ comprising indices of $K_{n_c}$ most reliable sub-channels from $Q_{ref}$ such that the $K_{n_c}$ indices are greater than or equal to $$\frac{N_{ref}}{4};$$

the encoder, a processor in a processor-based embodiment, or another component, is configured to determine a full information set A as a union of the selected information sets with adjusted offset indices:

$$A = \bigcup_{i=1}^{n_c} \left(A_i + \frac{(i-1)N_{ref}}{2}\right);$$

each of the subsets includes fewer than $N_{ref}$ sub-channels.

The apparatus 1800 could implement any of various other features that are disclosed herein. For example, the encoder module 1804, the transmitter module 1806, the code processing module 1810, the post-encoding processing module 1814, and/or a processor in a processor-based embodiment, could be configured to implement any one or more of the features listed or otherwise described herein.

In some alternative embodiments, the functionality of the encoder module 1804, the transmitter module 1806, the code processing module 1810, and/or the post-encoding processing module 1814 described herein may be fully or partially implemented in hardware or alternatively in software, for example in modules stored in a memory such as 1812 and executed by one or more processors of the apparatus 1800.

An apparatus could therefore include a processor, and a memory such as 1812, coupled to the processor, storing instructions which, when executed by the processor, cause the processor to perform the functionality and/or embodiments described above in relation to the encoder module 1804, the transmitter module 1806, the code processing module 1810, and/or the post-encoding module 1814 described herein.

Figure 19:
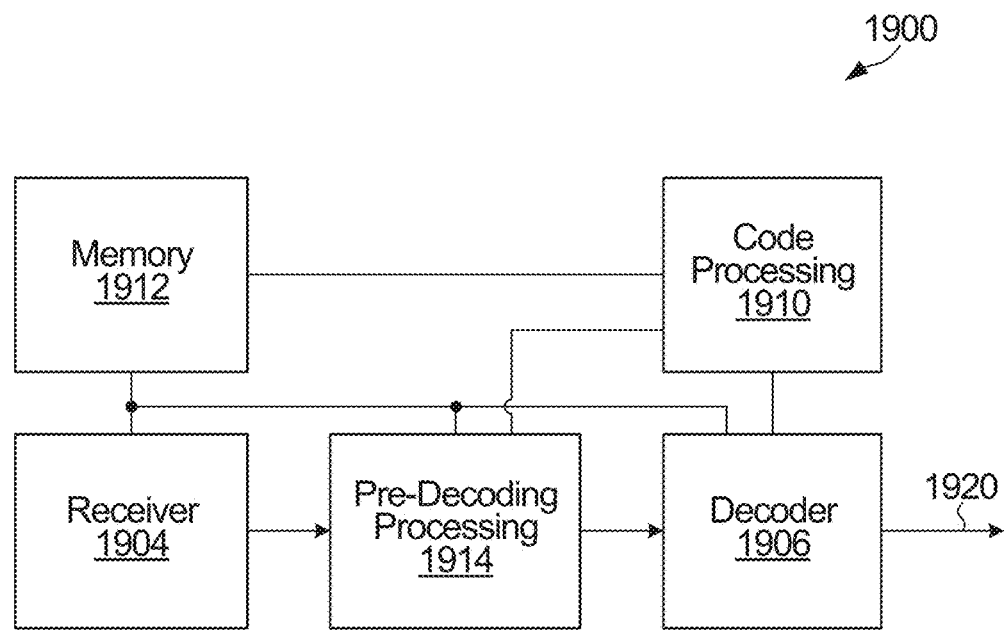
FIG. 19 is a block diagram of an example apparatus for receiving and decoding codewords.

FIG. 19 is a block diagram of an example apparatus for receiving and decoding codewords. The apparatus 1900 includes a receiver module 1904 which is configured to receive signals transmitted wirelessly and which is coupled to a decoder module 1906. The apparatus 1900 also includes a code processing module 1910 coupled to the decoder module 1906 and a pre-decoding processing module 1914. The pre-decoding processing module 1914 is also coupled to the decoder module 1906 and to the receiver module 1904. A memory 1912 also shown in FIG. 19, is coupled to the decoder module 1906, to the code processing module 1910, to the receiver module 1904, and to the pre-decoding processing module 1914.

Although not shown, the receiver module 1904 could include an antenna, demodulator, amplifier, and/or other modules or components of a receive chain or alternatively could be configured to interface with a separate (RF) receiving module. For example, some of all of the modules 1904, 1906, 1910, 1912, 1914 of the apparatus 1900 may be implemented in hardware or circuitry (e.g. in one or more chipsets, microprocessors, ASICs, FPGAs, dedicated logic circuitry, or combinations thereof) so as to receive a word based on a codeword of a chained polar code as described herein. Decoded bits are output at 1920 for further receiver processing.

In some embodiments, the memory 1912 is a non-transitory computer readable medium that includes instructions for execution by a processor to implement and/or control operation of the receiver module 1904, decoder module 1906, the code processing module 1910, and the pre-decoding processing module 1914 in FIG. 19, and/or to otherwise control the execution of functionality and/or embodiments described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a CD-ROM, USB flash disk, or a removable hard disk, at 1912.

The decoder module 1906 is implemented in circuitry, such as a processor, that is configured to decode received codewords as disclosed herein. In a processor-based implementation of the decoder module 1906, processor-executable instructions to configure a processor to perform decoding operations are stored in a non-transitory processor-readable medium. The non-transitory medium could include, in the memory 1912 for example, one or more solid-state memory devices and/or memory devices with movable and possibly removable storage media.

The code processing module 1910 is implemented in circuitry that is configured to determine (and store to the memory 1912) ordered sub-channel sequences as disclosed herein. In a processor-based implementation of the code-processing module 1910, processor-executable instructions to configure a processor to perform code-processing operations are stored in a non-transitory processor-readable medium, examples of which are described above. Information representing ordered sub-channel sequences, and/or the selected sub-channels could be provided to the decoder module 1906 by the code processing module 1910 for use in decoding received words, and/or stored in the memory 1912 by the code processing module 1910 for subsequent use by the decoder module 1906.

Like the decoder module 1906 and the code processing module 1910, the pre-decoding processing module 1914 is implemented in circuitry, such as a processor, that is configured to perform pre-decoding operations. These operations could include receiver/decoder-side rate matching operations also known as de-rate-matching operations, such as de-puncturing and/or de-shortening to reverse puncturing/shortening that was applied at an encoder/transmitter side, for example. In a processor-based implementation of the pre-decoding processing module 1914, processor-executable instructions to configure a processor to perform pre-decoding processing operations are stored in a non-transitory processor-readable medium, examples of which are described above. In an embodiment, the pre-decoding processing module 1914 derives a puncturing or shortening scheme from a puncturing or shortening scheme that is to be applied to a received codeword. Information indicative of bit positions and/or sub-channels that are affected by pre-decoding processing, or information from which such bit positions or sub-channels may be determined, may be fed back to the code processing module 1910, stored to the memory 1912, or otherwise made available to the code processing module 1910 by the pre-decoding processing module 1914.

In some embodiments of the code processing module 1910, the ordered sub-channel sequence may be determined based on information from the pre-decoding processing module 1914. For instance, the ordered sub-channel sequence may be determined based on the rate-matching scheme determined by the pre-decoding processing module 1914. Conversely, in some other embodiments, the pre-decoding processing module 1914 may determine a rate-matching scheme based on the coding parameters and/or the ordered sub-channel sequence determined by the code processing module 1910. In yet some other embodiments, the determinations made within the code processing module 1910 and pre-decoding processing module 1914 are jointly performed and optimized.

In some alternative embodiments, the functionality of the receiver module 1904, the decoder module 1906, the code processing module 1910, and/or the pre-decoding processing module 1914 described herein may be fully or partially implemented in software or modules, for example in receiving and decoding modules stored in a memory 1912 and executed by one or more processors of the apparatus 1900.

An apparatus could therefore include a processor, and a memory such as 1912, coupled to the processor, storing instructions which, when executed by the processor, cause the processor to perform the functionality and/or embodiments disclosed herein, or receiving/decoding operations corresponding to transmitting/encoding operations disclosed herein.

The apparatus 1900 could implement any of various other features that are disclosed herein. For example, the decoder module 1906, the receiver module 1904, the code processing module 1910, and/or the pre-decoding processing module 1914 could be configured to implement any one or more of receiving/decoding features corresponding to encoding/transmitting features disclosed herein.

Communication equipment could include the apparatus 1800, the apparatus 1900, or both a transmitter and a receiver and both an encoder and a decoder and other components shown in FIGS. 18 and 19. Such communication equipment could be user equipment or communication network equipment.

Figure 20:
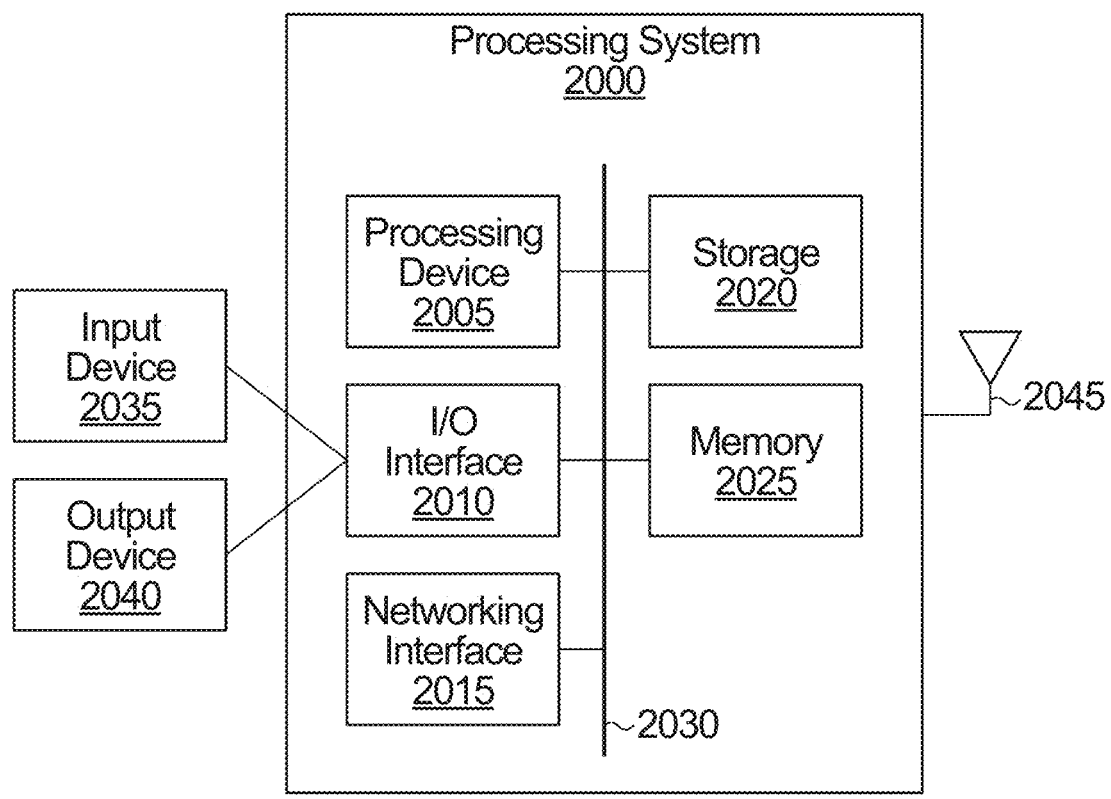
FIG. 20 is a block diagram of an example simplified processing system, which may be used to implement embodiments disclosed herein.

FIGS. 18 and 19 are generalized block diagrams of apparatus that could be used to implement embodiments disclosed herein. FIG. 20 is a block diagram of an example simplified processing system 2000, which may be used to implement embodiments disclosed herein, and provides a higher level implementation example. The apparatus 1800, the apparatus 1900, or both, may be implemented using the example processing system 2000, or variations of the processing system 2000. The processing system 2000 could be a server or a mobile device, for example, or any suitable processing system. Other processing systems suitable for implementing embodiments described in the present disclosure may be used, which may include components different from those discussed below. Although FIG. 20 shows a single instance of each component, there may be multiple instances of each component in the processing system 2000.

The processing system 2000 may include one or more processing devices 2005, such as a processor, a microprocessor, an ASIC, an FPGA, a dedicated logic circuitry, or combinations thereof. The processing system 2000 may also include one or more input/output (I/O) interfaces 2010, which may enable interfacing with one or more appropriate input devices 2035 and/or output devices 2040. The processing system 2000 may include one or more network interfaces 2015 for wired or wireless communication with a network (e.g., an intranet, the Internet, a P2P network, a WAN and/or a LAN) or other node. The network interfaces 2015 may include wired links (e.g., Ethernet cable) and/or wireless links (e.g., one or more antennas) for intra-network and/or inter-network communications. The network interfaces 2015 may provide wireless communication via one or more transmitters or transmit antennas and one or more receivers or receive antennas, for example. In this example, a single antenna 2045 is shown, which may serve as both transmitter and receiver. However, in other examples there may be separate antennas for transmitting and receiving. The processing system 2000 may also include one or more storage units 2020, which may include a mass storage unit such as a solid state drive, a hard disk drive, a magnetic disk drive and/or an optical disk drive.

The processing system 2000 may include one or more memories 2025, which may include a volatile or non-volatile memory (e.g., a flash memory, a random access memory (RAM), and/or a read-only memory (ROM)). The non-transitory memories 2025 may store instructions for execution by the processing devices 2005, such as to carry out examples described in the present disclosure. The memories 2025 may include other software instructions, such as for implementing an operating system and other applications/functions. In some examples, one or more data sets and/or modules may be provided by an external memory (e.g., an external drive in wired or wireless communication with the processing system 2000) or may be provided by a transitory or non-transitory computer-readable medium. Examples of non-transitory computer readable media include a RAM, a ROM, an erasable programmable ROM (EPROM), an electrically erasable programmable ROM (EEPROM), a flash memory, a CD-ROM, or other portable memory storage.

There may be a bus 2030 providing communication among components of the processing system 2000. The bus 2030 may be any suitable bus architecture including, for example, a memory bus, a peripheral bus or a video bus. In FIG. 20, the input devices 2035 (e.g., a keyboard, a mouse, a microphone, a touchscreen, and/or a keypad) and output devices 2040 (e.g., a display, a speaker and/or a printer) are shown as external to the processing system 2000. In other examples, one or more of the input devices 2035 and/or the output devices 2040 may be included as a component of the processing system 2000.

Figure 21:
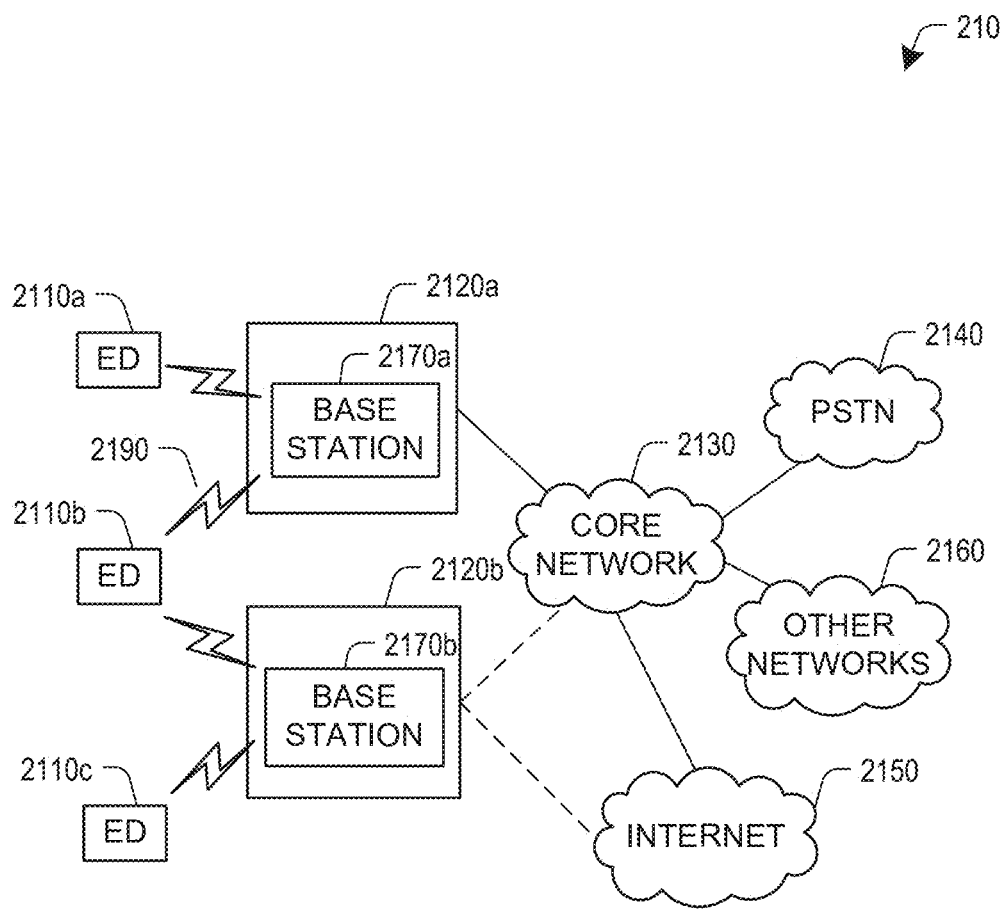
FIG. 21 illustrates an example communication system in which embodiments of the present disclosure could be implemented.

FIG. 21 illustrates an example communication system 2100 in which embodiments of the present disclosure could be implemented. In general, the communication system 2100 enables multiple wireless or wired elements to communicate data and other content. The purpose of the communication system 2100 may be to provide content (voice, data, video, text) via broadcast, narrowcast, user device to user device, etc. The communication system 2100 may operate by sharing resources such as bandwidth.

In this example, the communication system 2100 includes electronic devices (ED) 2110a-2110c, radio access networks (RANs) 2120a-2120b, a core network 2130, a public switched telephone network (PSTN) 2140, the internet 2150, and other networks 2160. Although certain numbers of these components or elements are shown in FIG. 21, any reasonable number of these components or elements may be included.

The EDs 2110a-2110c and base stations 2170a-2170b are examples of communication equipment that can be configured to implement some or all of the functionality and/or embodiments described herein. For example, any one of the EDs 2110a-2110c and base stations 2170a-2170b could be configured to implement the encoding or decoding functionality (or both) described above. In another example, any one of the EDs 2110a-2110c and base stations 2170a-2170b could include an apparatus 1800 (FIG. 18), an apparatus 1900 (FIG. 19), or both.

The EDs 2110a-2110c are configured to operate, communicate, or both, in the communication system 2100. For example, the EDs 2110a-2110c are configured to transmit, receive, or both via wireless or wired communication channels. Each ED 2110a-2110c represents any suitable end user device for wireless operation and may include such devices (or may be referred to) as a user equipment/device (UE), wireless transmit/receive unit (WTRU), mobile station, fixed or mobile subscriber unit, cellular telephone, station (STA), machine type communication (MTC) device, personal digital assistant (PDA), smartphone, laptop, computer, tablet, wireless sensor, or consumer electronics device.

In FIG. 21, the RANs 2120a-2120b include base stations 2170a-2170b, respectively. Each base station 2170a-2170b is configured to wirelessly interface with one or more of the EDs 2110a-2110c to enable access to any other base station 2170a-2170b, the core network 2130, the PSTN 2140, the Internet 2150, and/or the other networks 2160. For example, the base stations 2170a-2170b may include (or be) one or more of several well-known devices, such as a base transceiver station (BTS), a Node-B (NodeB), an evolved NodeB (eNodeB), a Home eNodeB, a gNodeB, a transmission point (TP), a site controller, an access point (AP), or a wireless router. Any ED 2110a-2110c may be alternatively or additionally configured to interface, access, or communicate with any other base station 2170a-2170b, the internet 2150, the core network 2130, the PSTN 2140, the other networks 2160, or any combination of the preceding. The communication system 2100 may include RANs, such as RAN 2120b, wherein the corresponding base station 2170b accesses the core network 2130 via the internet 2150, as shown.

The EDs 2110a-2110c and base stations 2170a-2170b are examples of communication equipment that can be configured to implement some or all of the functionality and/or embodiments described herein. In the embodiment shown in FIG. 21, the base station 2170a forms part of the RAN 2120a, which may include other base stations, base station controller(s) (BSC), radio network controller(s) (RNC), relay nodes, elements, and/or devices. Any base station 2170a, 2170b may be a single element, as shown, or multiple elements, distributed in the corresponding RAN, or otherwise. Also, the base station 2170b forms part of the RAN 2120b, which may include other base stations, elements, and/or devices. Each base station 2170a-2170b transmits and/or receives wireless signals within a particular geographic region or area, sometimes referred to as a "cell" or "coverage area". A cell may be further divided into cell sectors, and a base station 2170a-2170b may, for example, employ multiple transceivers to provide service to multiple sectors. In some embodiments, there may be established pico or femto cells where the radio access technology supports such. In some embodiments, multiple transceivers could be used for each cell, for example using multiple-input multiple-output (MIMO) technology. The number of RAN 2120a-2120b shown is exemplary only. Any number of RAN may be contemplated when devising the communication system 2100.

The base stations 2170a-2170b communicate with one or more of the EDs 2110a-2110c over one or more air interfaces 2190 using wireless communication links e.g. RF, microwave, infrared (IR), etc. The air interfaces 2190 may utilize any suitable radio access technology. For example, the communication system 2100 may implement one or more channel access methods, such as code division multiple access (CDMA), time division multiple access (TDMA), frequency division multiple access (FDMA), orthogonal FDMA (OFDMA), or single-carrier FDMA (SC-FDMA) in the air interfaces 2190.

A base station 2170a-2170b may implement Universal Mobile Telecommunication System (UMTS) Terrestrial Radio Access (UTRA) to establish an air interface 2190 using wideband CDMA (WCDMA). In doing so, the base station 2170a-2170b may implement protocols such as HSPA, HSPA+ optionally including HSDPA, HSUPA or both. Alternatively, a base station 2170a-2170b may establish an air interface 2190 with Evolved UTMS Terrestrial Radio Access (E-UTRA) using LTE, LTE-A, and/or LTE-B. It is contemplated that the communication system 2100 may use multiple channel access functionality, including such schemes as described above. Other radio technologies for implementing air interfaces include IEEE 802.11, 802.15, 802.16, CDMA2000, CDMA2000 1×, CDMA2000 EV-DO, IS-2000, IS-95, IS-856, GSM, EDGE, and GERAN. Of course, other multiple access schemes and wireless protocols may be utilized.

The RANs 2120a-2120b are in communication with the core network 2130 to provide the EDs 2110a-2110c with various services such as voice, data, and other services. The RANs 2120a-2120b and/or the core network 2130 may be in direct or indirect communication with one or more other RANs (not shown), which may or may not be directly served by core network 2130, and may or may not employ the same radio access technology as RAN 2120a, RAN 2120b or both. The core network 2130 may also serve as a gateway access between (i) the RANs 2120a-2120b or EDs 2110a-2110c or both, and (ii) other networks (such as the PSTN 2140, the internet 2150, and the other networks 2160). In addition, some or all of the EDs 2110a-2110c may include functionality for communicating with different wireless networks over different wireless links using different wireless technologies and/or protocols. Instead of wireless communication (or in addition thereto), the EDs 2110a-2110c may communicate via wired communication channels to a service provider or switch (not shown), and to the internet 2150. PSTN 2140 may include circuit switched telephone networks for providing plain old telephone service (POTS). Internet 2150 may include a network of computers and subnets (intranets) or both, and incorporate protocols, such as IP, TCP, UDP. EDs 2110a-2110c may be multimode devices capable of operation according to multiple radio access technologies, and incorporate multiple transceivers necessary to support such.

Figure 22A:
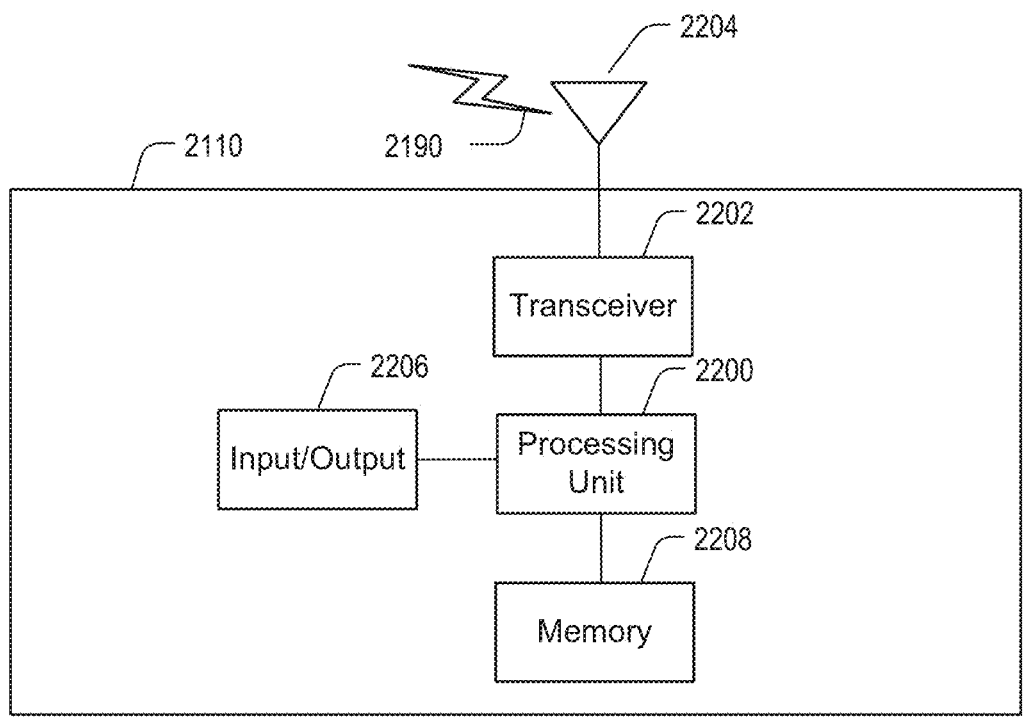
FIGS. 22A and 22B illustrate example devices that may implement the methods and teachings according to this disclosure.
Figure 22B:
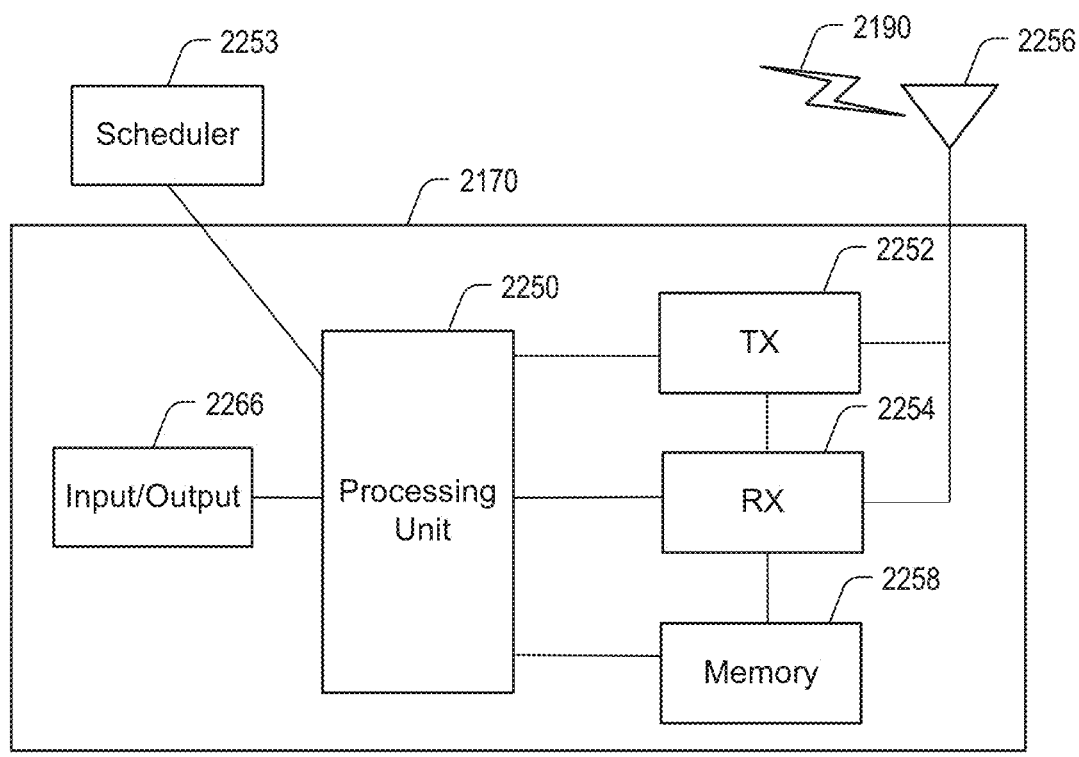

FIGS. 22A and 22B illustrate example devices that may implement the methods and teachings according to this disclosure. In particular, FIG. 22A illustrates an example ED 2110, and FIG. 22B illustrates an example base station 2170. These components could be used in the communication system 2100 or in any other suitable system.

As shown in FIG. 22A, the ED 2110 includes at least one processing unit 2200. The processing unit 2200 implements various processing operations of the ED 2110. For example, the processing unit 2200 could perform signal coding, data processing, power control, input/output processing, or any other functionality enabling the ED 2110 to operate in the communication system 2100. The processing unit 2200 may also be configured to implement some or all of the functionality and/or embodiments described in more detail above. Each processing unit 2200 includes any suitable processing or computing device configured to perform one or more operations. Each processing unit 2200 could, for example, include a microprocessor, microcontroller, digital signal processor, field programmable gate array, or application specific integrated circuit.

The ED 2110 also includes at least one transceiver 2202. The transceiver 2202 is configured to modulate data or other content for transmission by at least one antenna or Network Interface Controller (NIC) 2204. The transceiver 2202 is also configured to demodulate data or other content received by the at least one antenna 2204. Each transceiver 2202 includes any suitable structure for generating signals for wireless or wired transmission and/or processing signals received wirelessly or by wire. Each antenna 2204 includes any suitable structure for transmitting and/or receiving wireless or wired signals. One or multiple transceivers 2202 could be used in the ED 2110, and one or multiple antennas 2204 could be used in the ED 2110. Although shown as a single functional unit, a transceiver 2202 could also be implemented using at least one transmitter and at least one separate receiver.

The ED 2110 further includes one or more input/output devices 2206 or interfaces (such as a wired interface to the internet 2150). The input/output devices 2206 permit interaction with a user or other devices in the network. Each input/output device 2206 includes any suitable structure for providing information to or receiving information from a user, such as a speaker, microphone, keypad, keyboard, display, or touch screen, including network interface communications.

In addition, the ED 2110 includes at least one memory 2208. The memory 2208 stores instructions and data used, generated, or collected by the ED 2110. For example, the memory 2208 could store software instructions or modules configured to implement some or all of the functionality and/or embodiments described above and that are executed by the processing unit(s) 2200. Each memory 2208 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

As shown in FIG. 22B, the base station 2170 includes at least one processing unit 2250, at least one transmitter 2252, at least one receiver 2254, one or more antennas 2256, at least one memory 2258, and one or more input/output devices or interfaces 2266. A transceiver, not shown, may be used instead of the transmitter 2252 and receiver 2254. A scheduler 2253 may be coupled to the processing unit 2250. The scheduler 2253 may be included within or operated separately from the base station 2170. The processing unit 2250 implements various processing operations of the base station 2170, such as signal coding, data processing, power control, input/output processing, or any other functionality. The processing unit 2250 can also be configured to implement some or all of the functionality and/or embodiments described in more detail above. Each processing unit 2250 includes any suitable processing or computing device configured to perform one or more operations. Each processing unit 2250 could, for example, include a microprocessor, microcontroller, digital signal processor, field programmable gate array, or application specific integrated circuit.

Each transmitter 2252 includes any suitable structure for generating signals for wireless or wired transmission to one or more EDs or other devices. Each receiver 2254 includes any suitable structure for processing signals received wirelessly or by wire from one or more EDs or other devices. Although shown as separate components, at least one transmitter 2252 and at least one receiver 2254 could be combined into a transceiver. Each antenna 2256 includes any suitable structure for transmitting and/or receiving wireless or wired signals. Although a common antenna 2256 is shown here as being coupled to both the transmitter 2252 and the receiver 2254, one or more antennas 2256 could be coupled to the transmitter(s) 2252, and one or more separate antennas 2256 could be coupled to the receiver(s) 2254. Each memory 2258 includes any suitable volatile and/or non-volatile storage and retrieval device(s) such as those described above in connection to the ED 2110. The memory 2258 stores instructions and data used, generated, or collected by the base station 2170. For example, the memory 2258 could store software instructions or modules configured to implement some or all of the functionality and/or embodiments described above and that are executed by the processing unit(s) 2250.

Each input/output device 2266 permits interaction with a user or other devices in the network. Each input/output device 2266 includes any suitable structure for providing information to or receiving/providing information from a user, including network interface communications.

The previous description of some embodiments is provided to enable any person skilled in the art to make or use an apparatus, method, or processor readable medium according to the present disclosure.

The present disclosure relates in part to dynamic bit allocation based on a short reliability sequence. Using sub-channel sequences for component codes or sub-codes that are shorter in length than an overall chained polar code could reduce memory space requirements for ordered sequence storage, for example.

Some embodiments propose chained polar code construction according to which chained polar codes of length N are constructed from a reliability sequence $Q_{ref}$ of length $N_{ref}<N$. As mentioned above, using a short reliability sequence may be desired to decrease memory storage. As disclosed herein, $$\frac{2N}{N_{ref}} - 1$$

overlapping component polar codes or polar sub-codes could be used to construct a chained polar code of length N. Using a rate-allocation function in an embodiment, K information bit positions are distributed among these component codes and a final information set is obtained according to the short reliability sequence $Q_{ref}$.

Various modifications to the embodiments described herein may be readily apparent to those skilled in the art, and the generic principles of the methods and devices described herein may be applied to other embodiments. Thus, the present disclosure is not intended to be limited to the embodiments shown herein but is to be accorded the widest scope consistent with the principles and novel features disclosed herein.

For example, although embodiments are described primarily with reference to bits, other embodiments may involve non-binary multi-bit symbols. If one sub-channel can transmit more than one bit, then several bits can be combined into a symbol in a defined alphabet, and a non-binary symbol is encoded for each sub-channel. Accordingly, polarization kernels are not limited to binary kernels. Symbol-level (Galois field) or non-binary kernels are also contemplated. A non-binary kernel could be preferred for its higher degree of polarization than a binary kernel. However, decoding computation complexity is higher for a non-binary kernel, because a decoder would handle symbols rather than bits.

Non-binary kernels possess characteristics of binary kernels. Furthermore, non-binary kernels could be combined or cascaded with binary kernels to form one polar code.

As noted above, polar codes have been selected for uplink and downlink eMBB control channel coding for the new 5G air interface, also known as 5G new radio (NR). The techniques disclosed herein could be used not only for control data over a control channel but also or instead other types of data (e.g. user data) over any type of channel (e.g. a data channel).

Illustrative examples described herein refer to sub-channel sequences that are in increasing order of a reliability metric. In other embodiments, ordered sequences that are in decreasing reliability order could be used. Similarly, sequences could be generated in increasing order of reliability rather than starting with more reliable channels and building a sequence by adding sub-channels with progressively decreasing reliabilities.

The invention claimed is:

1. A method for encoding and transmitting input bits, the method comprising:
    selecting, from each of a plurality of subsets of sub-channels that are provided by a first polar code having a first length, a sub-channel to carry an information bit in the input bits that are to be encoded, the subsets comprising sub-channels associated with respective overlapping constituent polar codes of the first polar code, the constituent polar codes each having a same constituent length that is less than the first length, wherein at least two of the overlapping constituent polar codes share at least one bit position;
    wherein the selecting comprises selecting, from a given subset of the plurality of subsets, a respective number of reliable sub-channels;
    wherein:
        the respective number of reliable sub-channels is based on an equivalent respective channel capacity of the constituent polar code with which the given subset is associated;
        the equivalent respective channel capacity is determined by applying a capacity allocation function to an input capacity of the first polar code;
        the constituent polar codes comprise a total number of constituent polar codes, wherein the first polar code has a total number of reliable sub-channels, wherein, for each given subset of the plurality of subsets, the respective number of reliable sub-channels is given by:

$$K_1 = \left(\frac{3N_{ref}}{4} - 1\right)C_1, \ K_i = \frac{N_{ref}}{2}C_i,$$

and $$K_{n_c} = K - \Sigma_{j=2}^{n_c-1} K_j;$$

where $N_{ref}$ is the constituent length, $K_1$ is a first number of reliable sub-channels for a first given subset of the plurality of subsets, $C_1$ is a first equivalent channel capacity associated with the first given subset, i is an index for an i-th given subset excluding the first given subset and i has an integer value in the range from 2 to one less than a total number of constituent polar codes, $K_i$ is the respective number of reliable sub-channels for the i-th given subset, $C_i$ is the respective equivalent channel capacity associated with the i-th given subset, and $n_c$ is the total number of constituent polar codes;

the method further comprising:
    encoding the input bits to generate a codeword; and
    transmitting the codeword.

2. The method of claim 1, wherein a total number of the constituent polar codes is equal to $$\frac{2N}{N_{ref}} - 1$$

wherein N is the first length of the first polar code.

3. The method of claim 1, wherein the selecting comprises selecting the sub-channel from each of the subsets based on an ordered sub-channel reliability sequence, and wherein the ordered sub-channel reliability sequence has a sequence length that is equal to the constituent length.

4. The method of claim 1, wherein the selecting comprises:
selecting a first given information set comprising indices of $K_1$ most reliable sub-channels from an ordered sub-channel reliability sequence such that the $K_1$ indices are less than or equal to $$\frac{3N_{ref}}{4} - 1;$$

selecting an i-th given information set, wherein i has an integer value in the range from 2 to one less than the total number of constituent polar codes, comprising indices of $K_i$ most reliable sub-channels from the ordered sub-channel reliability sequence such that the $K_i$ indices are greater than or equal to $$\frac{N_{ref}}{4}$$

and less than $$\frac{3N_{ref}}{4};$$

and
selecting last given information set comprising indices of $K_{n_c}$ most reliable sub-channels from the ordered sub-channel reliability sequence such that the $K_{n_c}$ indices are greater than or equal to $$\frac{N_{ref}}{4}.$$

5. The method of claim 4, further comprising:
determining a full information set A as a union of all of the selected information sets with adjusted offset indices according to the equation:

$$A = \bigcup_{i=1}^{n_c} \left( A_i + \frac{(i-1)N_{ref}}{2} \right);$$

where A is the full information set, and $A_i$ is each selected information set, wherein $A_i$ is the selected first given information set when i is equal to 1, $A_i$ is the selected i-th given information set when i has an integer value in the range from 2 to one less than the total number of constituent polar codes, and $A_i$ is the selected last given information set when i is equal to the total number of constituent polar codes.

6. The method of claim 1, wherein each of the subsets comprises a respective number of sub-channels that is each less than the constituent length.

7. A non-transitory processor-readable medium storing instructions which, when executed by one or more processors, cause the one or more processors to perform a method for encoding and transmitting input bits, the method comprising:
selecting, from each of a plurality of subsets of sub-channels that are provided by a polar code having a first length, a sub-channel to carry an information bit in the input bits that are to be encoded, the subsets comprising sub-channels associated with respective overlapping constituent polar codes of the first polar code, the constituent polar codes each having a same constituent length that is less than the first length, wherein at least two of the overlapping constituent polar codes share at least one bit position;
wherein the selecting comprises selecting, from a given subset of the plurality of subsets, a respective number of reliable sub-channels;
wherein:
the respective number of reliable sub-channels is based on an equivalent respective channel capacity of the constituent polar code with which the given subset is associated;
the equivalent respective channel capacity is determined by applying a capacity allocation function to an input capacity of the first polar code;
the constituent polar codes comprise a total number of constituent polar codes, wherein the first polar code has a total number of reliable sub-channels, wherein, for each given subset of the plurality of subsets, the respective number of reliable sub-channels is given by:

$$K_1 = \left(\frac{3N_{ref}}{4} - 1\right)C_1, K_i = \frac{N_{ref}}{2}C_i,$$

and $$K_{n_c} = K - \sum_{j=2}^{n_c-1} K_j;$$

where $N_{ref}$ is the constituent length, $K_1$ is a first number of reliable sub-channels for a first given subset of the plurality of subsets, $C_1$ is a first equivalent channel capacity associated with the first given subset, i is an index for an i-th given subset excluding the first given subset and i has an integer value in the range from 2 to one less than a total number of constituent polar codes, $K_i$ is the respective number of reliable sub-channels for the i-th given subset, $C_i$ is the respective equivalent channel capacity associated with the i-th given subset, and $n_c$ is the total number of constituent polar codes;
the method further comprising:
encoding the input bits to generate a codeword; and
transmitting the codeword.

8. An apparatus for encoding and transmitting input bits, the apparatus comprising:
an encoder to select, from each of a plurality of subsets of sub-channels that are provided by a polar code having a first length, a sub-channel to carry an information bit in the input bits that are to be encoded, the subsets comprising sub-channels associated with respective overlapping constituent polar codes of the first polar code, the constituent polar codes each having a same constituent length that is less than the first length, wherein at least two of the overlapping constituent polar codes share at least one bit position, and to encode the input bits to generate a codeword;

wherein the encoder selects, from a given subset of the plurality of subsets, a respective number of reliable sub-channels;

wherein:
  the respective number of reliable sub-channels is based on an equivalent respective channel capacity of the constituent polar code with which the given subset is associated;
  the equivalent respective channel capacity is determined by applying a capacity allocation function to an input capacity of the first polar code;
  the constituent polar codes comprise a total number of constituent polar codes, wherein the first polar code has a total number of reliable sub-channels, wherein, for each given subset of the plurality of subsets, the respective number of reliable sub-channels is given by:

$$K_1 = \left(\frac{3N_{ref}}{4} - 1\right)C_1, \quad K_i = \frac{N_{ref}}{2}C_i,$$

and $$K_{n_c} = K - \sum_{j=2}^{n_c-1} K_j;$$

where $N_{ref}$ is the constituent length, $K_1$ is a first number of reliable sub-channels for a first given subset of the plurality of subsets, $C_1$ is a first equivalent channel capacity associated with the first given subset, i is an index for an i-th given subset excluding the first given subset and i has an integer value in the range from 2 to one less than a total number of constituent polar codes, $K_i$ is the respective number of reliable sub-channels for the i-th given subset, $C_i$ is the respective equivalent channel capacity associated with the i-th given subset, and $n_c$ is the total number of constituent polar codes;

the apparatus further comprising:
  a transmitter, coupled to the encoder, to transmit the codeword.

9. The apparatus of claim 8, wherein a total number of the constituent polar codes is equal to $$\frac{2N}{N_{ref}} - 1$$

wherein N is the first length of the first polar code.

10. The apparatus of claim 8, wherein the encoder is configured to select the sub-channel from each of the subsets based on an ordered sub-channel reliability sequence, and wherein the ordered sub-channel reliability sequence has a sequence length that is equal to the constituent length.

11. The apparatus of claim 8, wherein the encoder is configured to:
  select a first given information set comprising indices of $K_1$ most reliable sub-channels from an ordered sub-channel reliability sequence such that the $K_1$ indices are less than or equal to $$\frac{3N_{ref}}{4} - 1;$$

select an i-th given information set, wherein i has an integer value in the range from 2 to one less than the total number of constituent polar codes, comprising indices of $K_i$ most reliable sub-channels from the ordered sub-channel reliability sequence such that the $K_i$ indices are greater than or equal to $$\frac{N_{ref}}{4}$$

and less than $$\frac{3N_{ref}}{4};$$

and select last given information set comprising indices of $K_{n_c}$ most reliable sub-channels from the ordered sub-channel reliability sequence such that the $K_{n_c}$ indices are greater than or equal to $$\frac{N_{ref}}{4}.$$

12. The apparatus of claim 11, wherein the encoder is further configured to determine a full information set as a union of all of the selected information sets with adjusted offset indices according to the equation:

$$A = \bigcup_{i=1}^{n_c}\left(A_i + \frac{(i-1)N_{ref}}{2}\right);$$

where A is the full information set, and $A_i$ is each selected information set, wherein $A_i$ is the selected first given information set when i is equal to 1, $A_i$ is the selected i-th given information set when i has an integer value in the range from 2 to one less than the total number of constituent polar codes, and $A_i$ is the selected last given information set when i is equal to the total number of constituent polar codes.

13. The apparatus of claim 8, wherein each of the subsets comprises a respective number of sub-channels that is each less than the constituent length.

14. User equipment comprising the apparatus of claim 8.

15. Communication network equipment comprising the apparatus of claim 8.

* * * * *

UNITED STATES PATENT AND TRADEMARK OFFICE
CERTIFICATE OF CORRECTION

PATENT NO.         : 10,812,107 B2
APPLICATION NO.    : 15/875403
DATED              : October 20, 2020
INVENTOR(S)        : Hamid Saber and Yiqun Ge Page 1 of 1

It is certified that error appears in the above-identified patent and that said Letters Patent is hereby corrected as shown below:

In the Claims

In Column 29, Line 52 (Claim 5): "...determining a full information set A as a union of all of the..." should read -- determining a full information set as a union of all of the --.

In Column 30, Line 59 (Claim 7): "...with the i-th given subset, and n, is the total number..." should read -- with the i-th given subset, and $n_c$ is the total number --.

Signed and Sealed this
Twenty-seventh Day of July, 2021

Drew Hirshfeld
*Performing the Functions and Duties of the*
*Under Secretary of Commerce for Intellectual Property and*
*Director of the United States Patent and Trademark Office*